US009316683B2

(12) United States Patent
Richmond, II et al.

(10) Patent No.: US 9,316,683 B2
(45) Date of Patent: Apr. 19, 2016

(54) APPARATUS FOR TESTING ELECTRONIC DEVICES

(71) Applicant: AEHR TEST SYSTEMS, Fremont, CA (US)

(72) Inventors: Donald P. Richmond, II, Palo Alto, CA (US); Kenneth W. Deboe, Santa Clara, CA (US); Frank O. Uher, Los Altos, CA (US); Jovan Jovanovic, Santa Clara, CA (US); Scott E. Lindsey, Brentwood, CA (US); Thomas T. Maenner, San Ramon, CA (US); Patrick M. Shepherd, San Jose, CA (US); Jeffrey L. Tyson, Mountain View, CA (US); Mark C. Carbone, Cupertino, CA (US); Paul W. Burke, Hayward, CA (US); Doan D. Cao, San Jose, CA (US); James F. Tomic, Oakland, CA (US); Long V. Vu, San Jose, CA (US)

(73) Assignee: AEHR TEST SYSTEMS, Fremont, CA (US)

( * ) Notice: Subject to any disclaimer, the term of this patent is extended or adjusted under 35 U.S.C. 154(b) by 0 days.

(21) Appl. No.: 14/833,938

(22) Filed: Aug. 24, 2015

(65) Prior Publication Data

US 2015/0369858 A1 Dec. 24, 2015

Related U.S. Application Data

(62) Division of application No. 11/413,323, filed on Apr. 27, 2006, now Pat. No. 7,762,822.

(60) Provisional application No. 60/687,502, filed on Jun. 3, 2005, provisional application No. 60/682,989, filed on May 19, 2005, provisional application No. 60/675,546, filed on Apr. 27, 2005.

(51) Int. Cl.
*H01R 12/00* (2006.01)
*G01R 31/28* (2006.01)

(52) U.S. Cl.
CPC ................... *G01R 31/2872* (2013.01)

(58) Field of Classification Search
CPC ........... G01R 31/2887; G01R 31/2886; G01R 1/0491; G01R 31/2863; G01R 31/2855; G01R 31/2868; G01R 31/2642; G01R 31/003; G01R 31/26; G01R 31/2872
USPC ......................................................... 439/70
See application file for complete search history.

(56) References Cited

U.S. PATENT DOCUMENTS 4,477,170 A    10/1984    Yamada et al.
4,814,573 A *   3/1989    Check .................... B23H 7/265
                                                                                                      219/69.15

(Continued)

FOREIGN PATENT DOCUMENTS

EP            0639777 A1    8/1994
WO       2004/008163     1/2004

*Primary Examiner* — Jean F Duverne
(74) *Attorney, Agent, or Firm* — Stephen M. De Klerk

(57) ABSTRACT

An apparatus is described for burn-in and/or functional testing of microelectronic circuits of unsingulated wafers. A large number of power, ground, and signal connections can be made to a large number of contacts on a wafer. The apparatus has a cartridge that allows for fanning-in of electric paths. A distribution board has a plurality of interfaces that are strategically positioned to provide a dense configuration. The interfaces are connected through flexible attachments to an array of first connector modules. Each one of the first connector modules can be independently connected to a respective one of a plurality of second connector modules, thereby reducing stresses on a frame of the apparatus. Further features include for example a piston that allows for tight control of forces exerted by terminals onto contacts of a wafer.

10 Claims, 27 Drawing Sheets

(56) References Cited

U.S. PATENT DOCUMENTS

| | | |
|---|---|---|
| 6,040,700 A | 3/2000 | Berar |
| 6,255,834 B1 * | 7/2001 | Smith ............... G01R 31/043 324/538 |
| 6,340,895 B1 | 1/2002 | Uher et al. |
| 6,421,754 B1 | 7/2002 | Kau et al. |
| 6,509,751 B1 | 1/2003 | Mathieu et al. |
| 6,535,824 B1 | 3/2003 | Mansky et al. |
| 7,260,303 B2 | 8/2007 | Bench et al. |
| 7,382,142 B2 | 6/2008 | Chong et al. |
| 7,800,382 B2 | 9/2010 | Lindsey et al. |
| 7,826,995 B2 | 11/2010 | Maenner |
| 8,030,957 B2 | 10/2011 | Lindsey et al. |
| 8,506,335 B2 | 8/2013 | Richmond et al. |
| 2004/0113640 A1 | 6/2004 | Cooper et al. |
| 2004/0113645 A1 | 6/2004 | Richmond, II et al. |
| 2005/0042932 A1 | 2/2005 | Mok et al. |
| 2010/0244866 A1 | 9/2010 | Lindsey et al. |

* cited by examiner

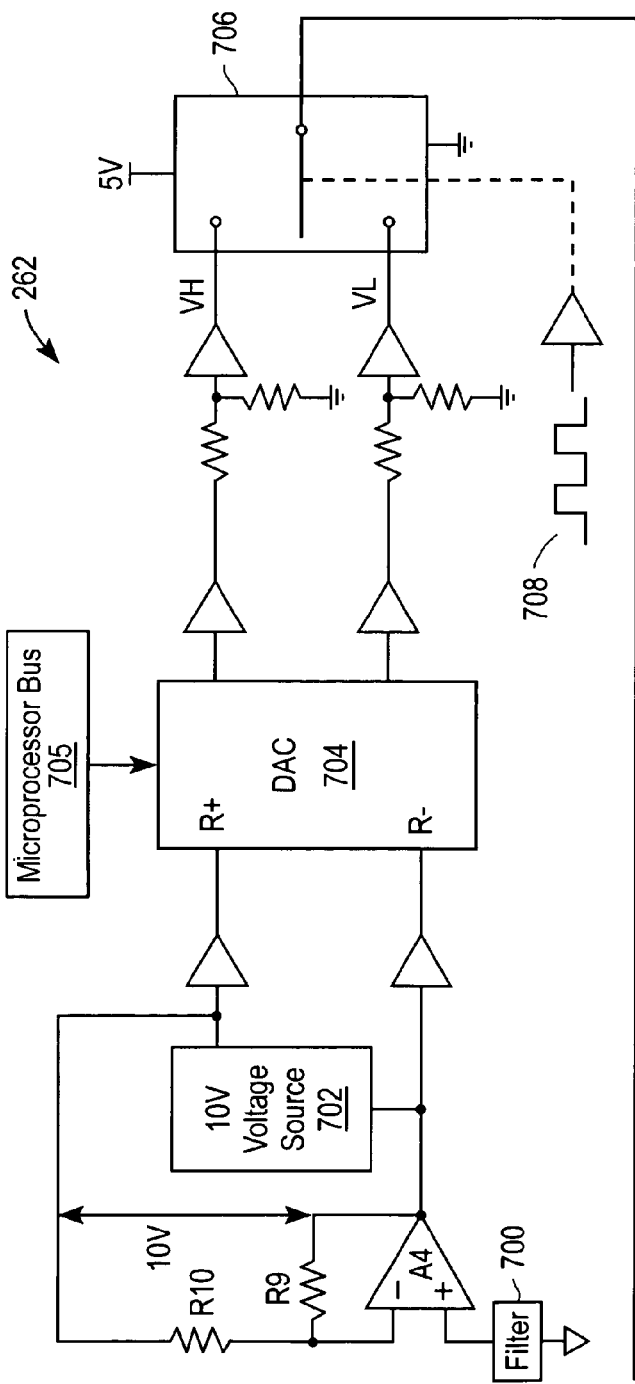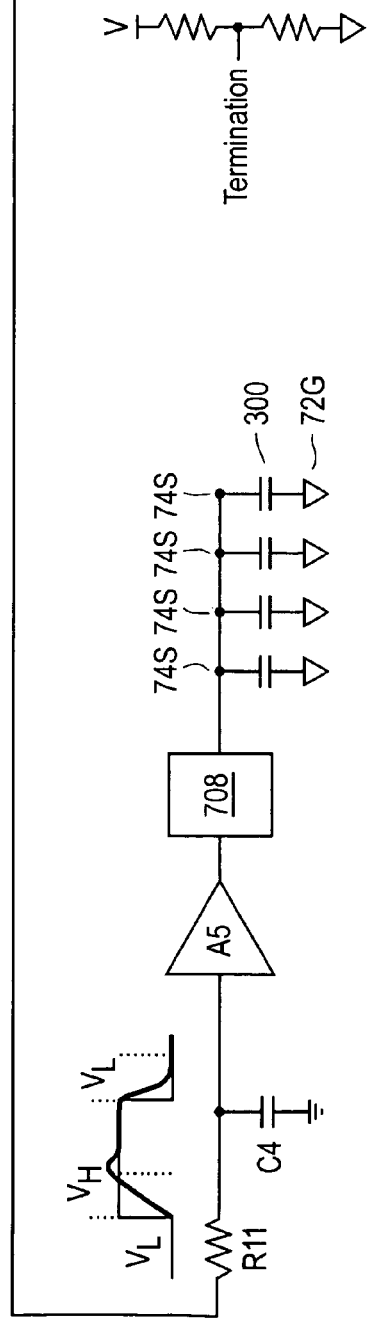
FIG. 30
FIG. 31 (PRIOR ART)

APPARATUS FOR TESTING ELECTRONIC DEVICES

CROSS-REFERENCE TO RELATED APPLICATIONS

This is a divisional of U.S. patent application Ser. No. 11/413,323 filed on Apr. 27, 2006, which is now U.S. Pat. No. 7,762,822 issued on Jul. 27, 2010 which claims priority from U.S. Provisional Patent Application No. 60/687,502, filed on Jun. 3, 2005, U.S. Provisional Patent Application No. 60/682,989, filed on May 19, 2005, and U.S. Provisional Patent Application No. 60/675,546, filed on Apr. 27, 2005 which are incorporated herein by reference in their entirety.

BACKGROUND OF THE INVENTION

1). Field of the Invention

This invention relates to an apparatus that is used for full-wafer testing and/or burn-in testing and/or built-in self-testing.

2). Discussion of Related Art

Microelectronic circuits are usually fabricated in and on semiconductor wafers. Such a wafer is subsequently "singulated" or "diced" into individual dies. Such a die is typically mounted to a supporting substrate for purposes of providing rigidity thereto and electronic communication with an integrated or microelectronic circuit of the die. Final packaging may include encapsulation of the die and the resulting package can then be shipped to a customer.

It is required that the die or the package be tested before being shipped to a customer. Ideally, the die should be tested at an early stage for the purposes of identifying the defects that occur during early stage manufacturing.

The earliest stage that a die can be tested is after completion of the manufacture of circuits at wafer level and before a wafer is singulated. Full wafer testing carries with it a number of challenges. One challenge in full wafer testing is that there are a large amount of contacts on a wafer and that a large number of power, ground, and signal connections thus have to be made.

SUMMARY OF THE INVENTION

The invention provides a contactor assembly, including a contactor support structure, a plurality of terminals, held by the contactor support structure, for contacting respective contacts of a device under test, at least first and second interfaces, on the contactor support structure, each having at least one row of contacts for contacting a respective terminal of a connector, the rows of the contacts of the interfaces being at an angle between 0 degrees and 180 degrees relative to one another, and a plurality of conductors, held by the contactor support structure, connecting the contacts of the interfaces and the terminals on the contactor support structure to one another.

The angle may be substantially 90 degrees.

The contactor assembly may comprise at least a third of said interfaces, wherein the row of contacts of the third interface is between the row of contacts of the first interface and the terminals held by the contactor support structure.

The rows of contacts of the first and third interfaces may be substantially parallel to one another.

The contactor support structure may have two threaded openings at opposing ends of each interface, for securing the respective connectors to the contactor support structure.

The contactor support structure may include a distribution substrate and a circular contactor substrate secured to the distribution substrate, the terminals held by the contactor support structure being held by the contactor substrate and the contacts on the contactor support structure being on the distribution substrate.

The invention also provides a contactor assembly, including a contactor support structure, a plurality of terminals, held by the contactor support structure, for contacting respective contacts of a device under test, at least first and second interfaces, on the contactor support structure, each having at least one row of contacts for contacting a respective terminal of a connector, the row of contacts of the second interface being between the row of contacts of the first interface and the terminals held by the contactor support structure, and a plurality of conductors, held by the contactor support structure, connecting the contacts of the interfaces and the terminals on the contactor support structure to one another.

The contactor assembly may comprise at least a third of said interfaces, wherein the row of contacts of the second interface is between the row of contacts of the first interface and the terminals held by the contactor support structure.

The contactor support structure may have two threaded openings at opposing ends of each interface, for securing the respective connectors to the contactor support structure.

The invention further provides a contactor assembly, including a contactor support structure, a plurality of terminals, held by the contactor support structure within an inner area of the contactor support structure, for contacting respective contacts of a device under test, a plurality of interfaces on the contactor support structure, each interface having at least one row of contacts for contacting a respective terminal of a connector, a combined length of the rows being more than a length of a periphery of the inner area, and a plurality of conductors, held by the contactor support structure, connecting the contacts of the interfaces and the terminals on the contactor support structure to one another.

The rows of the contacts of the interfaces may be at an angle between 0 degrees and 180 degrees relative to one another.

A row of contacts of a first of the interfaces may be between a row of contacts of a second of the interfaces.

The invention further provides an apparatus for testing an integrated circuit of a device, including an apparatus frame, a holder, having a surface against which the device is placed, mounted to the apparatus frame, a cartridge frame mounted to the apparatus frame, a contactor support structure, a contactor interface on the contactor support structure, a plurality of terminals held by the contactor support structure, a plurality of conductors, held by the contactor support structure, connecting the interface to the terminals, and an actuator connected between the cartridge frame and the contactor support structure, having first and second portions that are movable relative to one another to move the contactor support structure relative to the cartridge frame and toward the surface of the holder so that the terminals are urged against contacts of the device.

The first and second portions of the actuator may be a cylinder and a piston, respectively, the piston being located in the cylinder so that the cylinder and the piston jointly define a volume, further including a fluid line connected to the volume to modify a pressure of the volume and move the piston relative to the cylinder.

A travel sensor for measuring the movement of the contactor support relative to the cartridge frame may be provided.

The cartridge frame may include a lower backing plate and a support structure, and the travel sensor may include an outer portion attached to the support structure and an inner portion attached to the backing plate, and actuation of the actuator may cause the relative movement between the outer portion and the inner portion.

The travel sensor may measure the change of inductance or capacitance between the outer portion and the inner portion.

The invention further provides a cartridge, including a cartridge frame, formations on the cartridge frame for mounting the cartridge frame in a fixed position to an apparatus frame, a contactor support structure, a contactor interface on the contactor support structure, a plurality of terminals held by the contactor support structure, a plurality of conductors, held by the contactor support structure, connecting the interface to the terminals, and an actuator connected between the cartridge frame and the contactor support structure, having first and second portions that are movable relative to one another to move the contactor support structure relative to the cartridge frame.

The first and second portions of the actuator may use a cylinder and a piston, respectively, the piston being located in the cylinder so that the cylinder and the piston jointly define a volume, further including a fluid line connected to the volume to modify a pressure of the volume and move the piston relative to the cylinder.

A travel sensor for measuring the movement of the contactor support relative to the cartridge frame may be provided.

The cartridge frame may include a lower backing plate and a support structure, and the travel sensor may include an outer portion attached to the support structure and an inner portion attached to the backing plate, and actuation of the actuator may cause the relative movement between the outer portion and the inner portion.

The travel sensor may measure the change of inductance or capacitance between the outer portion and the inner portion.

The invention further provides a method of testing an integrated circuit of a device, including holding the device against a surface of a holder, actuating an actuator to move a contactor support structure relative to a frame and urge terminals on the contactor support structure against contacts on the device, and providing signals through the terminals and contacts to the integrated circuit.

The method further comprises moving the device with the holder relative to the frame in a direction toward the contactor support structure before urging the terminals against the contacts.

The method further comprises utilizing the actuator to move the terminals into contact with the contacts.

The actuator may include a cylinder and a piston in the cylinder, the piston being moved relative to the cylinder by changing a pressure on a surface of the cylinder.

The method may further include measuring the movement of the actuator.

The method may further include controlling the speed of movement of the actuator.

The invention further provides an apparatus for testing an integrated circuit of a device, including an apparatus frame; a holder, having a surface against which the device is placed, mounted to the apparatus frame; a cartridge frame mounted to the apparatus frame; a contactor support structure; a contactor interface on the contactor support structure; a plurality of terminals held by the contactor support structure; a plurality of conductors, held by the contactor support structure, connecting the interface to the terminals; a variable-force actuator connected between the cartridge frame and the contactor support structure, having first and second portions that are movable relative to one another to move the contactor support structure relative to the cartridge frame and toward the surface of the holder so that the terminals are urged against contacts of the device; and a travel sensor connected to the cartridge frame for measuring the movement of the cartridge frame relative to the apparatus frame.

The cartridge frame may include a lower backing plate and a support structure, and wherein the travel sensor may include an outer portion attached to the support structure and an inner portion attached to the backing plate, and wherein actuation of the actuator may cause the relative movement between the outer portion and the inner portion.

The device with the holder may be moveable relative to the frame in a direction toward the contactor support structure.

The variable-force actuator may include a piston.

The pressure of the piston may be set so that the piston is in the middle of its stroke when the terminals are urged against the contacts of the device.

The invention further includes an apparatus for testing an integrated circuit of a device, including an apparatus frame, an alignment formation on the apparatus frame, a holder, capable of holding the device, mounted to the apparatus frame, a cartridge frame, a contactor support structure mounted to the cartridge frame, a plurality of terminals on the contactor support structure, and a positioning formation on the cartridge frame, the positioning formation mating with the alignment formation to position the cartridge frame on the apparatus frame in a position wherein the terminals can make contact with contacts of the device upon movement of the terminals and the contacts relatively toward one another.

The apparatus comprises a plurality of alignment formations on the apparatus frame and a plurality of positioning formations on the cartridge frame, each mating with a respective one of the alignment formations.

The apparatus of further comprises a retaining mechanism releasably interconnecting the apparatus frame and the cartridge frame to prevent movement of the cartridge frame off the apparatus frame when the terminals are urged against the contacts.

The retaining mechanism may be remotely actuable.

The alignment formation may be an opening in the frame, the positioning formation being a positioning pin that is inserted into the opening, and the retaining formation engaging with a retaining formation on the positioning pin.

The apparatus further comprises an interface on the contactor support structure and a plurality of conductors interconnecting the terminals with contacts of the interface, and a flexible connector attached to the interface through which signals can be routed to the terminals and the contacts on the device.

The invention further provides a cartridge, including a cartridge frame, a plurality of positioning pins on the cartridge, each being insertable into a respective opening of an apparatus frame, and each having a retaining formation with which a retaining mechanism on the apparatus frame is engageable to secure the cartridge frame to the apparatus frame, a contactor support structure mounted to the cartridge frame, a plurality of terminals on the contactor support structure, each being positioned for contacting a respective contact of a device, an interface on the contactor support structure, and a plurality of conductors interconnecting the terminals with contacts of the interface.

The invention further provides a method for testing an integrated circuit of a device including moving a positioning formation toward an alignment formation to position a cartridge frame on an apparatus frame in a position wherein terminals of the cartridge frame can make contact with contacts of the device upon movement of the terminals and the contacts relatively toward one another; and engaging the positioning formation with the alignment formation.

The positioning formations may include a plurality of positioning pins insertable into a respective opening of the apparatus frame.

The positioning pins may include a retaining formation engageable with a retaining mechanism on the apparatus frame.

The invention further provides a connector system, including a first frame portion, a connector block support piece held by the first frame portion, a first connector block held by the connector block support piece, a plurality of terminals and contacts held by the first connector block, a first engagement component mounted to the connector block support piece, a second frame portion, a second connector block held by the second frame portion, a plurality of terminals and contacts held by the second connector block, a second engagement component mounted to the second frame portion, the second engagement component being releasably engageable with the first engagement component, and a component actuator connected to the second engagement component, the component actuator, upon actuation, causing movement of the second and first engagement components relative to the second frame portion, and movement of the connector block support piece relative to the first frame portion so that the contacts on the first connector block come into contact with the terminals on the second connector block.

The actuator may include a cylinder and a piston in the cylinder, the second engagement component being a shaft that extends from the cylinder and having an engagement formation thereon, wherein the first engagement component has an engagement formation thereon and is movable relative to the connector support piece between a first position, wherein the engagement formation on the first engagement component is disengaged from the engagement formation on the second engagement component, and a second position wherein the engagement formations of the first and second engagement components engage with one another.

The invention further provides a connector system, including a first frame portion, a second frame portion, a plurality of connector sets, each set including a connector block support piece held by the first frame portion, a first connector block held by the connector block support piece, a plurality of terminals and contacts held by the first connector block, a first engagement component mounted to the connector block support piece, a second connector block held by the second frame portion, a plurality of terminals and contacts held by the second connector block, a second engagement component mounted to the second frame portion, the second engagement component being releasably engageable with the first engagement component, and a component actuator connected to the second engagement component, and an engager which is movable between a disengaging position wherein the first engagement components are disengaged from the second engagement components, and an engaging position wherein the engager has moved the first engagement components into engagement with the second engagement components, the component actuator, upon actuation, causing movement of the second and first engagement components relative to the second frame portion, and movement of the connector block support piece relative to the first frame portion so that the contacts on the first connector block come into contact with the terminals on the second connector block.

The connector system further comprises an engager actuator connected to the engager, the engager actuator moving the engager between the engaging and disengaging positions.

The connector sets may be located in at least one row.

The invention further provides an engager including first engagement components connected with a first connector block having a plurality of contacts; second engagement components connected with a second connector block having a plurality of terminals; and an actuator to move the first engagement components from a disengaging position, wherein the first engagement components are disengaged from the second engagement components, to an engaging position wherein the first engagement components are engaged with the second engagement components to contact the contacts of the first connector block with the terminals of the second connector block.

The first engagement components may be mounted to a first connector block support piece, the first connector block support piece supporting the first connector block and wherein the second engagement components may be mounted to a second connector block support piece, the second connector block support piece supporting the first connector block.

The first engagement components may include slider pins, and wherein the second engagement components comprise slider openings corresponding to the slider pins.

The actuator may include a cylinder and a piston in the cylinder.

The actuator may include a cylinder and a piston in the cylinder, the second engagement component being a shaft that extends from the cylinder and having an engagement formation thereon, wherein the first engagement component has an engagement formation thereon and is movable relative to the connector support piece between a first position, wherein the engagement formation on the first engagement component is disengaged from the engagement formation on the second engagement component, and a second position wherein the engagement formations of the first and second engagement components engage with one another.

The invention further provides an apparatus for testing an integrated circuit of a device, including an apparatus frame having first, second, and third portions, a holder for the device mounted to the first portion of the apparatus frame, a plurality of first connector modules held by the second portion of the apparatus frame, each having a body and a plurality of terminals and contacts on the body, a contactor support structure, a plurality of terminals on the contactor support structure, the contactor support structure being positioned so that the terminals thereon can make contact with contacts on the device, a plurality of conductors connecting the terminals on the contactor support structure with the terminals of the first connector modules, and a plurality of second connector modules held by the third portion of the apparatus frame, each having a body and a plurality of terminals and contacts on the body, the contacts of the first connector modules being engageable with the terminals of the second connector modules.

The third portion of the apparatus frame may be movable relative to the second portion of the apparatus frame to move the second connector modules relatively toward the first connector modules.

The first connector modules may be located in an array having a plurality of rows and columns.

The first connector modules may be located over a first area and the terminals on the contactor support structure are located over a second area, the first area being larger than the second area.

The apparatus comprises a plurality of flexible ribbons, each including a flexible outer layer and a respective set of the conductors within the respective flexible outer layer.

The body of each respective first connector module may have a plurality of slots formed therein and the contacts of the first connector module are within the slots, and wherein each respective second connector module has a plurality of substrates held by the body of the second connector module and the terminals of the second connector module being located on the substrates, the substrates being insertable into the slots.

The invention further provides a cartridge, including a cartridge frame, a plurality of first connector modules held by the cartridge frame, each having a body and a plurality of terminals and contacts on the body, a contactor support structure mounted to the cartridge frame, a plurality of terminals, for contacting contacts on a device, on the contactor support structure, and a plurality of conductors connecting the terminals on the contactor support structure with the terminals of the first connector modules.

The first connector modules may be located in an array having a plurality of rows and columns.

The first connector modules may be located over a first area and the terminals on the contactor support structure are located over a second area, the first are being larger than the second area.

The cartridge comprises a plurality of flexible ribbon, each including a flexible outer layer and the conductors within the flexible outer layer.

The body of each respective first connector module may have a plurality of slots formed therein and the contacts of the first connector module are within the slots.

The invention further provides a method for testing an integrated circuit of a device including providing a plurality of first connector modules held by a portion of an apparatus frame, the plurality of first connector modules including a plurality of terminals and contacts; providing a plurality of second connector modules held by a different portion of the apparatus frame, the plurality of second connector modules including a plurality of terminals and contacts; and engaging the contacts of the first connector modules with the terminals of the second connector modules.

The portion of the apparatus frame holding the second connector modules may be moveable relative to the portion of the apparatus frame holding the first connector modules.

The invention also provides an apparatus for testing integrated circuits of a plurality of devices, comprising at least one holder to hold the plurality of devices, a tester system having a plurality of output channels and an interconnection scheme to connect the channels to a plurality of contacts of the plurality of devices, the contacts being connected to the integrated circuits, a computer system having memory, a test program stored in the memory, the test program having a series of instructions written for testing one of the devices, a configuration file stored in the memory, the configuration file representing a relationship between the channels and the contacts of the plurality of devices, and a test application that utilizes the test program and the configuration file to provide signals in accordance with the series of instructions of the test program through the channels and the interconnection scheme to the contacts of the plurality of devices and the integrated circuits.

The interconnection scheme may also include a plurality of configurable pattern generator boards, each representing a respective zone, the configuration file having a zone number field indicating a plurality of respective ones of the zones.

The interconnection scheme may also have a plurality of boards inserted into a plurality of slots, the configuration file having a slot number field indicating a plurality of respective ones of the slot numbers.

The configuration file may have channel, number, and pad labeled fields to represent the relationship between the channels and the contacts of the plurality of devices.

The devices may be located in rows and columns, the configuration file having column and row fields indicating the respective row and column of each respective die.

The interconnection scheme may have a line connected to a set of the devices and a plurality of respective select lines connected to respective ones of the devices of the set, further comprising a shared resources map in the memory, the shared resources map representing a relationship between the select lines and the devices of the set.

The select lines may be grouped into chip select states.

The shared resources map may form part of the configuration file.

The apparatus may further comprise a test results file stored in memory, and may have a processing application that utilizes the test results file and the configuration file to provide a test output and optional test input.

The test application may utilize the test results file to selectively modify signals in accordance with the series of instructions of the test program through the channels and the interconnection scheme to the contacts of the plurality of devices and the integrated circuits.

The test application may utilize the test results file to selectively modify the sequence of signals in accordance with the series of instructions of the test program through the channels and the interconnection scheme to the contacts of the plurality of devices and the integrated circuits.

The invention also provides a method of testing integrated circuits of a plurality of devices, comprising storing a test program having a series of instructions written for testing one of the devices, storing a configuration file representing a relationship between a plurality of channels and a plurality of contacts of the plurality of devices, and providing signals in accordance with the series of instructions of the test program through the channels to the plurality of contacts of the plurality of devices, utilizing the configuration file to map the series of instructions of the test program to the plurality of contacts of the plurality of devices.

The devices may be a portion of a wafer.

The method may further comprise uploading test results provided from the devices through the configuration scheme and utilizing the test results and the configuration file to prepare a test report.

The test results may be uploaded from memory on a plurality of boards including at least one driver board and at least one power board.

The test results may be used to modify the signals provided to the plurality of devices and the integrated circuits.

The test results may be used to modify the application of power provided to the plurality of devices and the integrated circuits.

The test results may be used to modify the signals provided to the plurality of devices and the integrated circuits to balance their power consumption.

The test results may be used to selectively sort devices into groups based upon their power consumption.

The test results may be used to modify the sequence of signals provided to the plurality of devices and the integrated circuits.

The invention may also include a software assembly method, comprising storing a plurality of net files, each net file having information representing a scheme of current passing through conductors of a respective electrical subassembly, providing an input of an interconnection scheme of a plurality of the electrical subassemblies connected to one another; and assembling a plurality of the net files based on the interconnection scheme to construct a configuration file having information representing flow of current through the electrical subassemblies of the interconnection scheme.

The input may be provided manually.

The electrical subassemblies may include pattern generator, driver, and power boards.

The electrical subassemblies may include a plurality of pattern generator, driver, and power boards divided into physical zones with each physical zone including one pattern generator board, at least one driver board, and at least one power board connected to one another.

The configuration file may have a zone name field indicating a plurality of respective ones of the physical zones.

Physical zones having the same zone name field may be grouped into a logical zone.

The electrical subassemblies in the logical zone may be of the same type and run the same test program at the same time.

The configuration file may have channel number and pad label fields to represent a relationship between channels and contacts of a plurality of devices.

The interconnection scheme may have a line connected to a set of the devices and a plurality of respective select lines connected to respective ones of the devices of the set, further comprising using the net files to construct a shared resources map representing a relationship between the select lines and the devices of the set.

The select lines may be grouped into chip select states.

The invention may include a software assembler application, comprising a plurality of net files, each file having information representing a scheme of current passing through conductors of a respective electrical sub assembly; an input module to provide an input of an interconnection scheme of a plurality of electrical sub assemblies, and an assembly module that assembles a plurality of the net files based on the interconnection scheme and constructs a configuration file having information representing flow of current through the electrical sub assemblies of the interconnection scheme.

The input module may include an interface with a list of selectable inputs.

The interface may allow an operator to select the input of the interconnection scheme.

The electrical subassemblies may be selected from one or more of the group consisting of a pattern generator board, driver board and a power board.

The input may include how the electrical subassemblies are to be connected to one another.

The invention may include an apparatus for testing a device having an integrated circuit, comprising a frame including a base portion, and test head and thermal system portions secured to the base portion, a holder secured to the base portion, the holder being capable of holding the device, a test head mounted to the test head portion in a position such that electric signals can be sent through the test head to the integrated circuit of the device, and a thermal system located in a position to cool components of the test head, and being mounted through the thermal system portion to the base portion.

The thermal system may be mounted through the thermal system portion to the base portion without being mounted to the test head portion.

The test head may include a test head support structure, a plurality of electric components mounted to the test head support structure, and a panel that forms a passage through which air can flow before flowing over the electric components.

The electric components may be boards, the test head support structure having a plurality of slots that hold the boards.

The thermal system may include a shell through which the air can flow and at least one heat dissipation device in the shell, the shell forming an interface with the panel, with a gap being defined between the shell and the panel.

The heat dissipation device may include a plurality of fins over which the air flows.

The thermal system may include a fan that moves the air through the shell.

The thermal system may include a variable frequency drive to vary the speed of the fan.

The thermal system may include a thermocouple in the test head portion, and wherein the variable frequency drive varies the speed of the fan in accordance with a measurement of the thermocouple.

The thermal system portion and the test head portion may be mounted for pivotal movement relative to one another.

The invention may have an apparatus for testing a device having an integrated circuit, comprising a base portion, a holder for the device mounted to the base portion, a test head portion and a thermal system portion mounted to the base portion, a test head mounted to the test head portion, the test head including a test head support structure, a plurality of electric components mounted to the test head support structure, and a panel that forms a passage through which air can flow before flowing over the electric components, and a thermal system mounted through the thermal system frame to the base portion, the thermal system including a shell through which the air can flow and at least one heat dissipation device in the shell, the shell forming an interface with the panel, with a gap being defined between the shell and the panel.

The electric components may be boards, the test head support structure having a plurality of slots that hold the boards, and the thermal system includes a fan that moves the air through the shell.

The thermal system portion and the test head portion may be mounted for pivotal movement relative to one another.

The invention further provides a method for testing a device having an integrated circuit including electrically connecting a tester apparatus with the device; and cooling the tester apparatus with a thermal system without the thermal system contacting the tester apparatus.

The test head may include a test head support structure, a plurality of electric components mounted to the test head support structure, and a panel that forms a passage through which air can flow before flowing over the electric components; and the thermal system may be mounted through the thermal system frame to the base portion, and the thermal system may include a shell through which the air can flow and at least one heat dissipation device in the shell, the shell forming an interface with the panel, with a gap being defined between the shell and the panel.

The method may further include moving air through the shell.

A fan may move air through the shell.

Cooling the tester apparatus may include recirculating air from the thermal system back to the tester apparatus.

The thermal system may include a fan controllable by a variable speed drive.

The thermal system may include a thermocouple connected with the test system, the thermocouple in communication with the variable speed drive of the fan.

The method may further include adjusting the speed of the fan in accordance with a measurement of the thermocouple.

Cooling the test system may include controlling the temperature of the test system.

The invention may include a tester apparatus, comprising at least one power terminal for making contact with a power contact of a device carrying an integrated circuit, a power supply circuit configured to supply a plurality of different voltages, and at least one electric path connecting the power supply circuit with the power terminal.

The apparatus may further comprise an apparatus frame, a holder for the device mounted to the frame, and a contactor support structure, the power terminal being located on the contactor support structure.

The apparatus may further comprise a power board substrate, the power supply circuit and a portion of the electric path being carried by the power board substrate.

The power supply circuit may include a power input circuit providing a step voltage, a length of time that the step voltage is high during a period being adjustable while maintaining the period, and a maximum voltage constant, and a power converter circuit, connected to the power input circuit, converting the step voltage to a supply voltage, a magnitude of the supply voltage being related to the time that the step voltage is high during each period of the step voltage.

The apparatus may further comprise a plurality of power terminals, each for making contact with a respective contact of a respective device carrying a respective integrated circuit, and a plurality of electric paths, each connecting the power supply circuit to a respective terminal.

A plurality of the electric paths may be at a plurality of different voltage levels.

An adjustment in a voltage provided by the power supply circuit may change voltages of a subset of the electric paths in unison, so that the electric paths of the subset are always at the same voltage.

The plurality of different voltages may include a voltage output of 0.5V to 12V at a current of at least 200 mA.

The plurality of different voltages may include a voltage output of 0.1V to 5V at a current of at least 500 mA.

The invention further provides a method for testing an integrated circuit of a device including supplying a plurality of different voltages to at least one power terminal; and contacting the at least one power terminal with a power contact of the device.

Supplying a plurality of different voltages may include providing a step voltage; and converting the step voltage to a supply voltage.

The step voltage has a length of time that the step voltage is high during a period being adjustable while maintaining the period, and wherein the magnitude of the supply voltage may be related to the time that the step voltage is high during each period of the step voltage.

The method may further include supplying a plurality of different voltages to a plurality of power terminals; and contacting the plurality of power terminals with a plurality of respective contacts of the device.

Supplying a plurality of different voltages to a plurality of power terminals may include supplying each power terminal with a different voltage level.

The method may further include adjusting the supplied voltage.

Adjusting the supplied voltage may change voltages of a subset of the power terminals in unison, the subset of power terminals always being at the same voltage.

The invention may include an apparatus for testing integrated circuits of a plurality of devices, comprising a plurality of power terminals, each for making contact with a respective power contact of a respective one of the devices, at least one power supply, a plurality of electric paths, each connecting said at least one power supply to a respective one of the power terminals, and a plurality of individual shut-off circuits, each including a respective current sense circuit detecting a respective current in a respective one of the electric paths, and a respective power switch in a respective one of the electric paths, each power switch being connected to a respective current sense circuit and turning off when the current detected by the respective current sense circuit exceeds a predetermined maximum current.

Each shut-off circuit may include a logic device that at least delays activation of the power switch after the current exceeds the predetermined maximum current.

The shut-off circuit may include a logic switch that turns a shut-off voltage on, the shut-off voltage being provided to the power switch to turn the power switch off.

The power switch may be a MOSFET.

The invention may include a method of testing integrated circuits of a plurality of devices, comprising providing a power voltage to each integrated circuit, providing signals to each integrated circuit, detecting a power current that is provided to each integrated circuit, and individually turning the power voltage to one of the integrated circuits off, if the power current exceeds a predetermined maximum current.

The method may further include delaying turning the power voltage to the integrated off when the power current exceeds a predetermined maximum current.

Turning the power voltage to one of the integrated circuits off may include turning a shut-off voltage on.

The method may further include detecting a power current provided to a power terminal of the device; and turning the power to the device off if the power current exceeds a predetermined maximum current.

The method may further include detecting a power voltage provided to a power terminal of the device; and turning the power to the device off if the power voltage exceeds a predetermined maximum voltage.

The invention further provides an apparatus for testing an integrated circuit of a device including a power supply; a test signal line; and a switching circuit between the power supply and a terminal for contacting a contact of the device, the switching circuit drawing current from the terminal when the test signal is provided to the switching circuit.

The switching circuit may include a resistor and a MOSFET.

The resistor may be connected to the power supply, and the MOSFET is connected in series after the resistor.

The test signal may be provided to the MOSFET.

The MOSFET may draw power from the power supply when the test signal is provided to the switching circuit.

The invention further provides a method for testing an integrated circuit of a device include providing a test signal to a switching circuit; and drawing current from the device to the switching circuit when the switching current receives the test signal.

The switching circuit may include a MOSFET, and wherein the test signal is provided to the MOSFET.

The invention further provides a method for testing an integrated circuit of a device including providing a test signal to a switching circuit; disabling current to the device; and providing the current to the switching circuit.

The switching circuit may include a MOSFET, and wherein the test signal is provided to the MOSFET.

The invention may include a tester apparatus, comprising at least one power terminal for making contact with a power contact of a device carrying an integrated circuit, a power supply, and an electrical path connecting the power supply to the power terminal, the electrical path including at least a first set of power conductors electrically parallel to one another, having respective first ends connected to one another and respective second ends connected to one another.

The tester apparatus may further comprise a power board substrate, wherein the first set of power conductors is carried by the power board substrate.

The first set of power conductors may be traces on the power board substrate.

The electrical path may include a second set of power conductors that are electrically in series with the first set of power conductors, the second set of power conductors being electrically parallel to one another, having respective first ends connected to one another and respective second ends connected to one another.

The second set of power conductors may form part of a flexible attachment that further includes a nonconductive layer, the power conductors being held within the nonconductive layer.

The invention further provides a method for testing an integrated circuit of a device including connecting a power supply with a power terminal of the device; providing a plurality of power conductors between the power supply and the power terminal conductors having respective first ends connected to one another and respective second ends connected to one another; and conducting current from the power supply through the plurality of power conductors in parallel.

Conducting the current in parallel may obtain a high-frequency response.

The invention further provides an apparatus for testing an integrated circuit of a device including a pattern generator board; a driver board connected to the pattern generator board; a power board; an interconnection scheme connecting the driver board and the power board with the device.

Each of the pattern generator board, driver board, power board and interconnection scheme may be configurable.

The number of each of the pattern generator board, driver board and the power board may be configurable.

The interconnection scheme may include at least a first set of power conductors electrically parallel to one another, having respective first ends connected to one another and respective second ends connected to one another.

The interconnection scheme may further include a second set of power conductors that are electrically in series with the first set of power conductors, the second set of power conductors being electrically parallel to one another, having respective first ends connected to one another and respective second ends connected to one another.

The invention may include an apparatus for testing a device carrying an integrated circuit, comprising a power terminal for making contact with a power contact of the device, a power supply, an electrical power force path connecting the power supply to the power terminal, a ground terminal for making contact with a grand contact of the device, and a ground sense feedback circuit connected between the ground terminal and the electrical power path, the ground sense feedback circuit utilizing a voltage sensed by the ground terminal to modify a voltage provided through the electrical power force path to the power contact.

The apparatus may further comprise a plurality of ground terminals, the ground sense feedback circuit being connected to the plurality of ground terminals.

The apparatus may further comprise a plurality of power terminals, each for making contact with a respective power contact of a respective device, and a plurality of electrical power force paths, each connecting a respective power terminal to the power supply.

The ground sense feedback circuit may be connected to the plurality of electrical power force paths to modify a voltage of each electrical power force path.

The power sense feedback circuit may be connected between the power terminal and the electrical path, the power sense feedback circuit utilizing a voltage sensed by the power terminal to modify a voltage provided through the electrical force path to the power contact.

The power sense feedback circuit may have a reference voltage line, inputs from the reference voltage line and the power terminals being compared to determine a modification of the voltage provided through the electrical power force path.

A voltage sensed by the ground feedback circuit may be used to modify a voltage of the reference voltage line.

The invention may include a method of testing a device having an integrated circuit, comprising providing a power voltage to a power contact of the device, sensing a ground voltage on a ground contact of the device, and modifying the power voltage based on the ground voltage that is sensed.

The method may further comprise sensing the power voltage provided to the power contact, and modifying the power voltage based on the power voltage that is sensed.

Sensing the ground voltage may include adding the ground voltage to a variable input voltage.

Modifying the power voltage may be based on a sum of the ground voltage and the power voltage.

Modifying the power voltage based on the ground voltage that is sensed may include, if the sensed ground voltage is not zero, driving a variable output voltage to the sum of the ground voltage and the variable input voltage.

Modifying the power voltage based on the ground voltage that is sensed may further include providing the variable output voltage to the power contact of the device.

The invention may include an apparatus for testing an integrated circuit of a device, comprising a voltage source, a voltage switch connected to the voltage source, a signal source connected to the voltage switch, a signal provided by the signal source switching the voltage switch so that an output of the signal switch switches between respective low- and high-voltage states to create a series of voltage steps, a damping circuit having an input connected to the output of the signal switch, the damping circuit reducing a slew rate each voltage step, and having an output providing a series of dampened voltage steps, and a signal terminal, connected to the output of the damping circuit, for contacting a contact of the device.

The apparatus may comprise a plurality of signal terminals, each connected to the damping circuit but located at different distances from the damping circuit as measured along a path that current flows from the damping circuit.

The damping circuit may include a resistor in series between the voltage switch and the terminal and a capacitor connected between a terminal of the resistor and ground.

The apparatus may further comprise a digital-to-analog converter (DAC), a microprocessor bus line connected to the DAC for data representing the high and low voltages into the DAC, the high and low voltages being provided by two output terminals of the DAC.

The voltage source may be connected between two input terminals of the DAC.

The two input terminals of the DAC may be held at positive and negative voltages respectively.

The apparatus may further comprise a ground sense line connected to a ground contact of the device, the input voltages of the DAC being in part driven by a voltage on the ground sense line.

The invention further provides a method for testing an integrated circuit of a device including providing a signal to a voltage switch, the voltage switch switching between respective low- and high-voltage states to create a series of voltage steps to create a series of voltage steps; reducing a slew rate of each voltage step to provide a series of dampened voltage steps; and providing the series of dampened voltage steps to a contact of the device.

The series of dampened voltage steps may be provided to a plurality of contacts of the device, each of the contacts at different distances from the path that current flows.

The invention further provides a damping circuit for an apparatus for testing an integrated circuit device including a voltage switch; a signal terminal for contacting a contact of the device; a resistor in series between the voltage switch and the signal terminal; and a capacitor connected between a terminal of the resistor and the signal terminal.

The damping circuit may further include a plurality of signal terminals, the capacitor connected between a terminal of the resistor and the plurality of signal terminals, the signal terminals at different distances from the capacitor as measured along a path that current flows from the capacitor.

The invention may include an apparatus for testing an integrated circuit of a device, comprising at least one frame, a holder for the device, secured to the frame, a support structure held by the frame, a plurality of terminals held by the support structure, the holder and support structure being movable relative to one another so that each one of the terminals releasably makes contact with a respective contact of the device, a power source to supply AC and DC power, a power electrical path connecting the power source to a power terminal of the terminals held by the support structure, a signal source, a plurality of signal electrical paths, each connecting the signal source to a respective signal terminal of the terminals held by the support structure, a ground plate connected to the at least one frame, an AC ground path interconnecting the terminals and the ground plate, and a DC ground path interconnecting the terminals and the ground plate.

The AC ground path and the DC ground path may be electrically separated.

The AC ground path may have a resistance between 0.5 and 1.5 ohms and the DC ground path has a resistance between 0.003 and 0.015 ohms.

The apparatus may include a ground pin, the ground pin connected to the power source.

The physical space between the AC power provision, signal line and AC power ground may be small.

The DC ground path may be connected to the support structure.

The invention further provides a method for testing an integrated circuit of a device including holding the device against a surface of a tester; contacting terminals on the tester to contacts on the device; providing signals through the terminals and contacts to the integrated circuit; providing AC and DC power to the terminals.

Providing the AC and DC power to the terminals may include electrically separating the AC and DC power.

The method may further include providing separate AC ground and DC ground paths.

The invention further provides a board for providing power to an apparatus for testing an integrated circuit of a device including a power source to supply AC and DC power; a power electrical path to connect the power source to a power terminal of the device; a ground pin; an AC ground path interconnecting terminals of the device and the ground pin; and a DC ground path interconnecting terminals of the device and the ground pin.

The AC ground path and the DC ground path may be electrically separated.

The AC ground path may have a resistance between 0.5 and 1.5 ohms and the DC ground path may have a resistance between 0.003 and 0.015 ohms.

The physical space between the AC power provision, signal line and AC power ground may be small.

The board may further include a power board substrate, the power source, power electrical path, ground pin, and AC and DC ground paths provided on the power board substrate.

The invention may include an apparatus for testing an integrated circuit of a device, comprising at least one frame, a holder for the device, secured to the frame, a support structure held by the frame, a plurality of terminals held by the support structure, the holder and support structure being movable relative to one another so that each one of the terminals releasably makes contact with a respective contact of the device, a power source, a power electrical path connecting the power source to a power terminal of the terminals held by the support structure, a signal source, and a plurality of signal electrical paths, each connecting the signal source to a respective signal terminal of the terminals held by the support structure.

The invention further provides an apparatus for testing an integrated circuits on devices including a plurality of electrical subassemblies including a plurality of pattern generator, driver, and power boards divided into physical zones with each physical zone including one pattern generator board, at least one driver board, and at least one power board connected to one another; and a configuration file having information representing flow of current through the electrical subassemblies connected to one another in an interconnection scheme, wherein the electrical subassemblies are organized into at least one logical zone, and wherein the logical zone comprises a plurality of pattern generators.

The electrical subassemblies may be organized into a plurality of logical zones, and wherein one or more of the logical zones comprises a plurality of pattern generators.

The at least one logical zone may be divided into a plurality of the physical zones.

The configuration file may have a zone name field indicating a plurality of respective ones of the physical zones.

Physical zones having the same zone name field may be grouped into a logical zone.

The electrical subassemblies in the logical zone may be of the same type and run the same test program at the same time.

The electrical subassemblies in each of the plurality of logical zones may be of the same type and run the same test program at the same time, and wherein each of the plurality of logical zones runs a different test program at the same time.

The invention further provides a method for testing integrated circuits on devices including running more than one test program on the device simultaneously.

Running more than one test program on the device simultaneously may include providing a plurality of electrical subassemblies including a plurality of pattern generator, driver, and power boards divided into physical zones with each physical zone including one pattern generator board, at least one driver board, and at least one power board connected to one another, the electrical subassemblies are organized into at least one logical zone, and wherein the logical zone comprises a plurality of pattern generators; providing a configuration file having information representing flow of current through the electrical subassemblies connected to one another in an interconnection scheme; and running a test program through the at least one logical zone.

Running more than one test program on the device simultaneously may include providing a plurality of electrical subassemblies including a plurality of pattern generator, driver, and power boards divided into physical zones with each physical zone including one pattern generator board, at least one driver board, and at least one power board connected to one another, the electrical subassemblies are organized into a plurality of logical zones, and wherein each of the logical zones comprises a plurality of pattern generators; providing a configuration file having information representing flow of current through the electrical subassemblies connected to one another in an interconnection scheme; and running a test program through each of the logical zones simultaneously.

BRIEF DESCRIPTION OF THE DRAWINGS

The invention is further described by way of example with reference to the accompanying drawings wherein:

FIG. 30 is a circuit diagram illustrating components that are replicated on a driver board illustrated in FIGS. 22 and 27; and FIG. 31 is a circuit diagram illustrating a termination that is used in conventional design for purposes of damping a test signal.

DETAILED DESCRIPTION OF THE INVENTION

Figure 1:
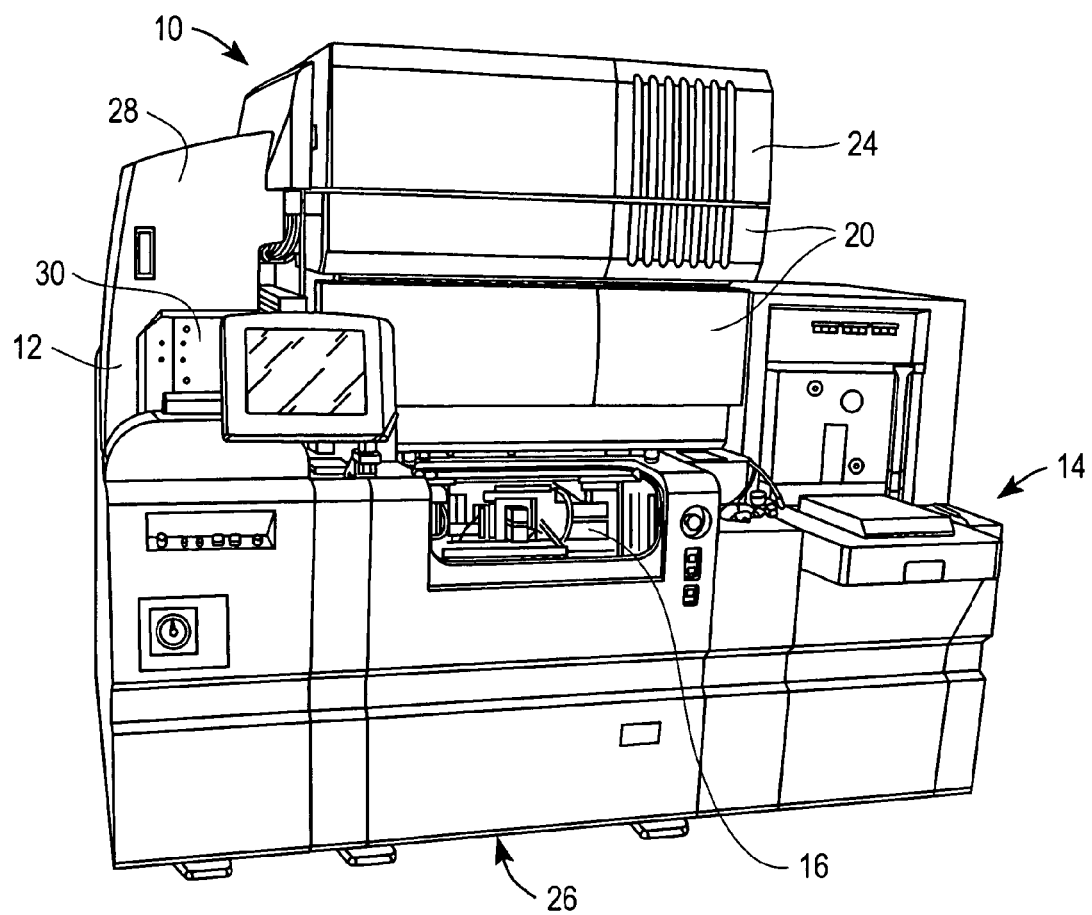
FIG. 1 is a perspective view of an apparatus, according to an embodiment of the invention, which can be used for full-wafer testing and/or burn-in and/or built-in self-testing.
Figure 2:
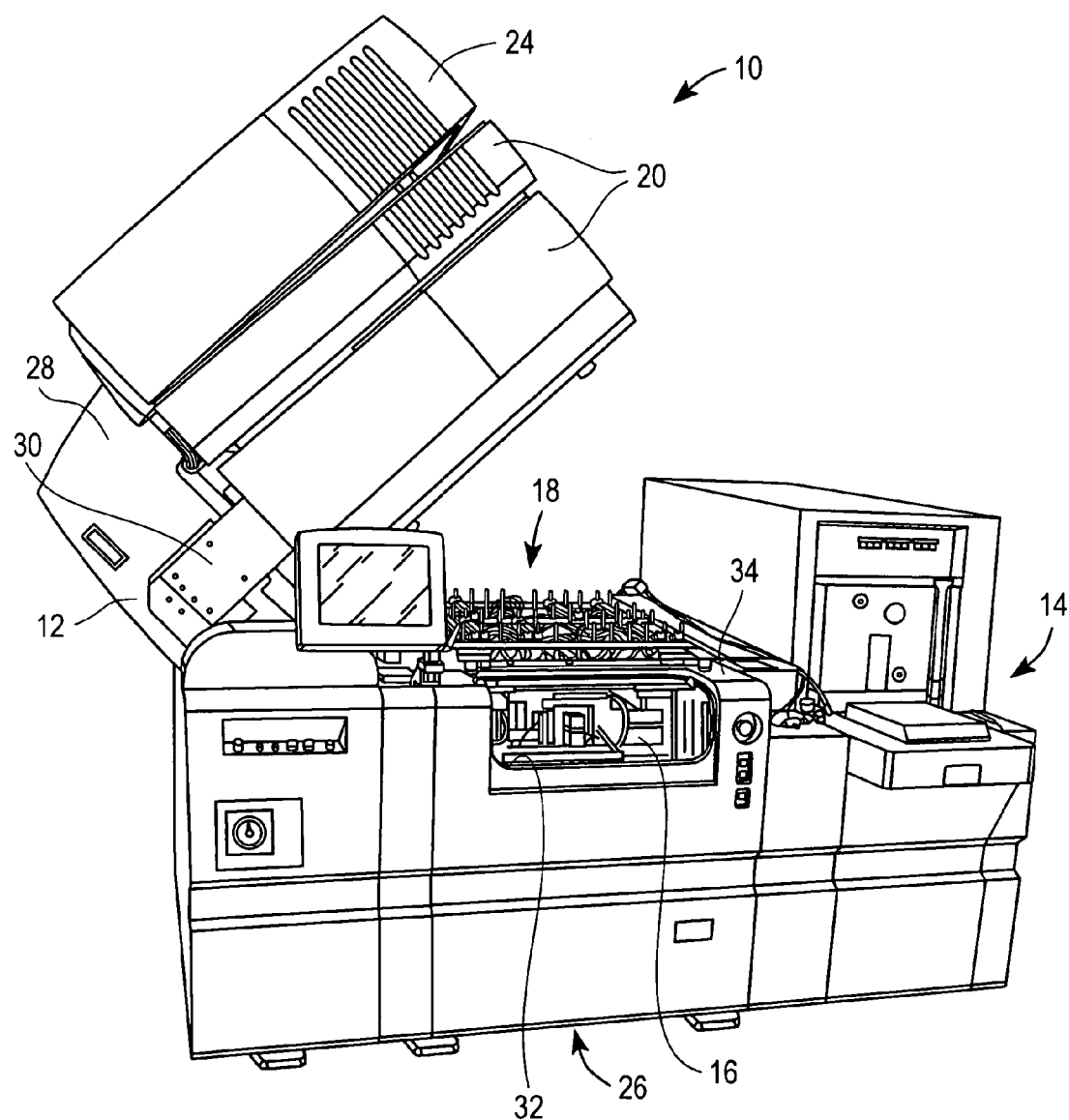
FIG. 2 is a view similar to FIG. 1 wherein a thermal system frame portion is rotated approximately 45 degrees counter-clockwise.

FIGS. 1 and 2 of the accompanying drawings illustrate an apparatus 10, which is particularly suitable for full-wafer testing of microelectronic circuits of unsingulated wafers and/or burn-in testing of unsingulated wafers and/or built-in self-testing of unsingulated wafers. The apparatus 10 includes a frame 12 and a number of modules mounted to the frame 12 including a wafer loader 14, a probing subassembly 16, a cartridge 18, a test head 20, and a thermal system 24.

The frame 12 has a prober base portion 26, a thermal system frame portion 28, and a test head frame portion 30. The thermal system frame portion 28 is pivotally mounted to the prober base portion 26. The test head frame portion 30 is pivotally mounted to the thermal system frame portion 28. The probing subassembly 16 and the cartridge 18 are mounted to lower and upper portions 32 and 34 respectively of the prober base portion 26, the test head 20 and the thermal system 24 are mounted to the test head frame portion 30 and the thermal system frame portion 28 respectively.

The thermal system frame portion 28 can, for example, be pivoted between a position as shown in FIG. 1 wherein the thermal system frame portion 28 is over the prober base portion 26, and a position as shown in FIG. 2 wherein the pivot arm portion is pivoted approximately 45 degrees counterclockwise to the left. Pivoting of the thermal system frame portion 28 into the position shown in FIG. 2 moves the test head 20 away from the cartridge 18. Access is thereby gained to the cartridge 18 for purposes of maintenance to or replacement of the cartridge 18.

Figure 3:
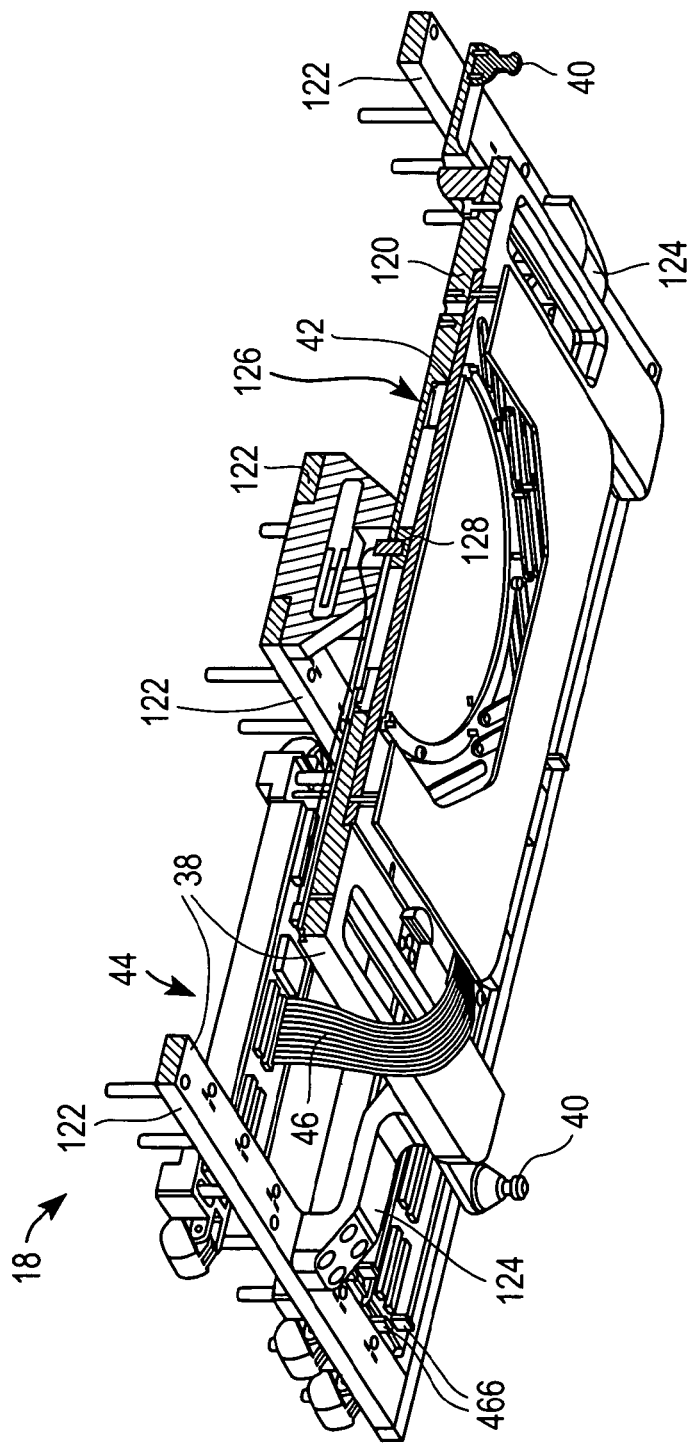
FIG. 3 is a sectioned perspective view from below illustrating a replaceable cartridge forming part of the apparatus of FIGS. 1 and 2.

As illustrated in FIG. 3, the cartridge 18 includes a cartridge frame 38, alignment pins 40 for aligning and locking the cartridge frame 38 in a fixed position, a contactor assembly 42, a plurality of first connector sets 44, and a plurality of flexible attachments 46 connecting the contactor assembly 42 to the first connector sets 44.

Figure 4:
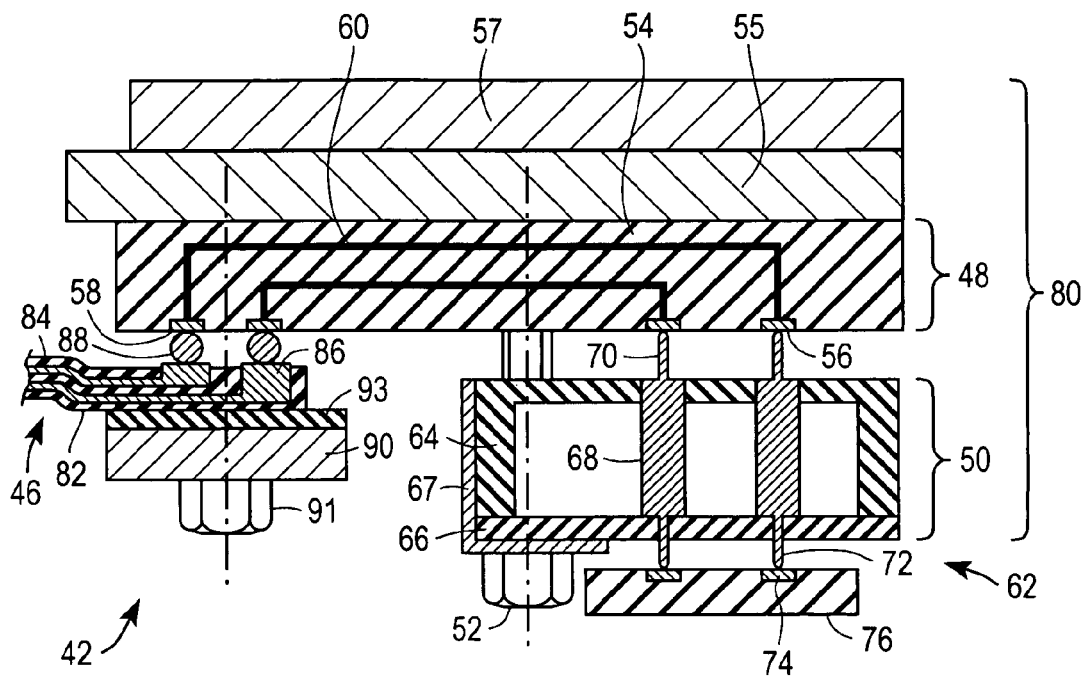
FIG. 4 is a cross-sectional side view illustratively illustrating a contactor assembly forming a lower part of the cartridge of FIG. 3.

As shown in FIG. 4, the contactor assembly 42 includes a distribution board 48, a contactor board 50 and fasteners 52 that secure the contactor board 50 to the distribution board 48.

Distribution board 48 has a force distribution substrate 55, a thermal expansion equalization substrate 57, and an electrical distribution substrate 54, a plurality of terminals 56 formed on the electrical distribution substrate 54, a plurality of contacts 58 formed on the electrical distribution substrate 54, and a plurality of conductors 60 carried within the electrical distribution substrate 54. The terminals 56 and the contacts 58 are formed on the same side but on different areas of the electrical distribution substrate 54. Each conductor 60 interconnects a respective one of the terminals 56 with a respective one of the contacts 58.

The contactor board 50 includes a contactor substrate 62 having first and second pieces 64 and 66, a collar 67, and a plurality of pins 68. One end of each pin 68 is inserted through an opening in the first piece 64, and then inserted through an opening in the second piece 66. Each pin 68 has a central body that is larger than its ends so that it is held in place by the opening in the second piece 66. The collar 67 is used to align the first and second pieces 64 and 66 relative to one another. One end of each pin 68 forms a contact 70 that is placed against a respective terminal 56 of the distribution board 48. An opposing end of each pin 68 forms a terminal 72 that can touch a contact 74 on a wafer 76. The fasteners 52 may, for example, be bolts, each having a shank that is inserted though an opening in the contactor substrate 62, and thread on the shank is then screwed into a threaded opening in the electrical distribution substrate 54. The electrical distribution substrate 54, the contactor substrate 62, force distribution substrate 55, expansion equalization substrate 57, and the fasteners 52 jointly form a support structure 80 with the terminals 72 extending from the support structure 80. The pins 68, terminals 56, conductors 60, and contacts 58 form conductive links to and from the terminals 72.

Each one of the flexible attachments 46 has a flexible nonconductive outer layer 82, a plurality of conductors 84 held within the outer layer 82 and separated from one another by the material of the outer layer 82, a plurality of open terminals 86 at ends of the respective conductors 84, and a plurality of electrically conductive bumps 88, each on a respective one of the terminals 86. Each one of the conductive bumps 88 is placed against a respective one of the contacts 58 of the distribution board 48. A clamp piece 90 is placed over an end of the flexible attachment 46. Fasteners 9 are used to secure the clamp piece 90 to the electrical distribution substrate 54 and provide a force that clamps the end of the flexible attachment 46 between the clamp piece 90 and the electrical distribution substrate 54.

Figure 5:
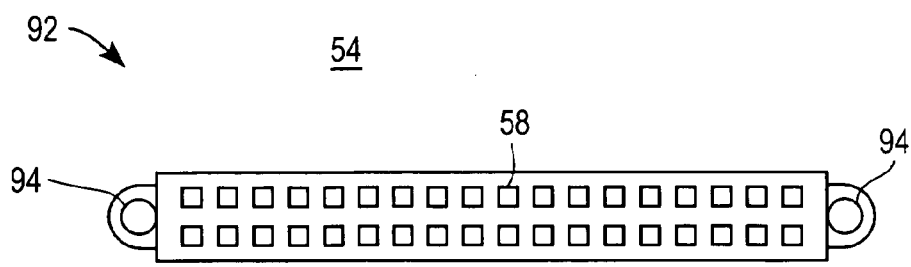
FIG. 5 is a bottom plan view of one interface of contacts on a distribution board of the contactor assembly of FIG. 5.

As further shown in FIG. 5, the contacts 58 form an interface 92. The interface 92 has two parallel rows of the contacts 58. Two of the contacts 58g are ground contacts that extend from one of the rows to the other and are located at opposing ends of the rows. Threaded openings 94 are formed on opposing ends of the interface 92 into the electrical distribution substrate 54. Each one of fasteners 91 in FIG. 4 has a respective head and a respective threaded shank extending from the head. The head rests on the clamp piece 90 and the shank is screwed into one of the threaded openings 94 in FIG. 5. A compliant member 93 is located between the clamp piece 90 and the flexible nonconductive outer layer 82 to distribute a force created by the clamp piece 90 to ensure uniform contact by the electrically conductive bumps 88.

Figure 6:
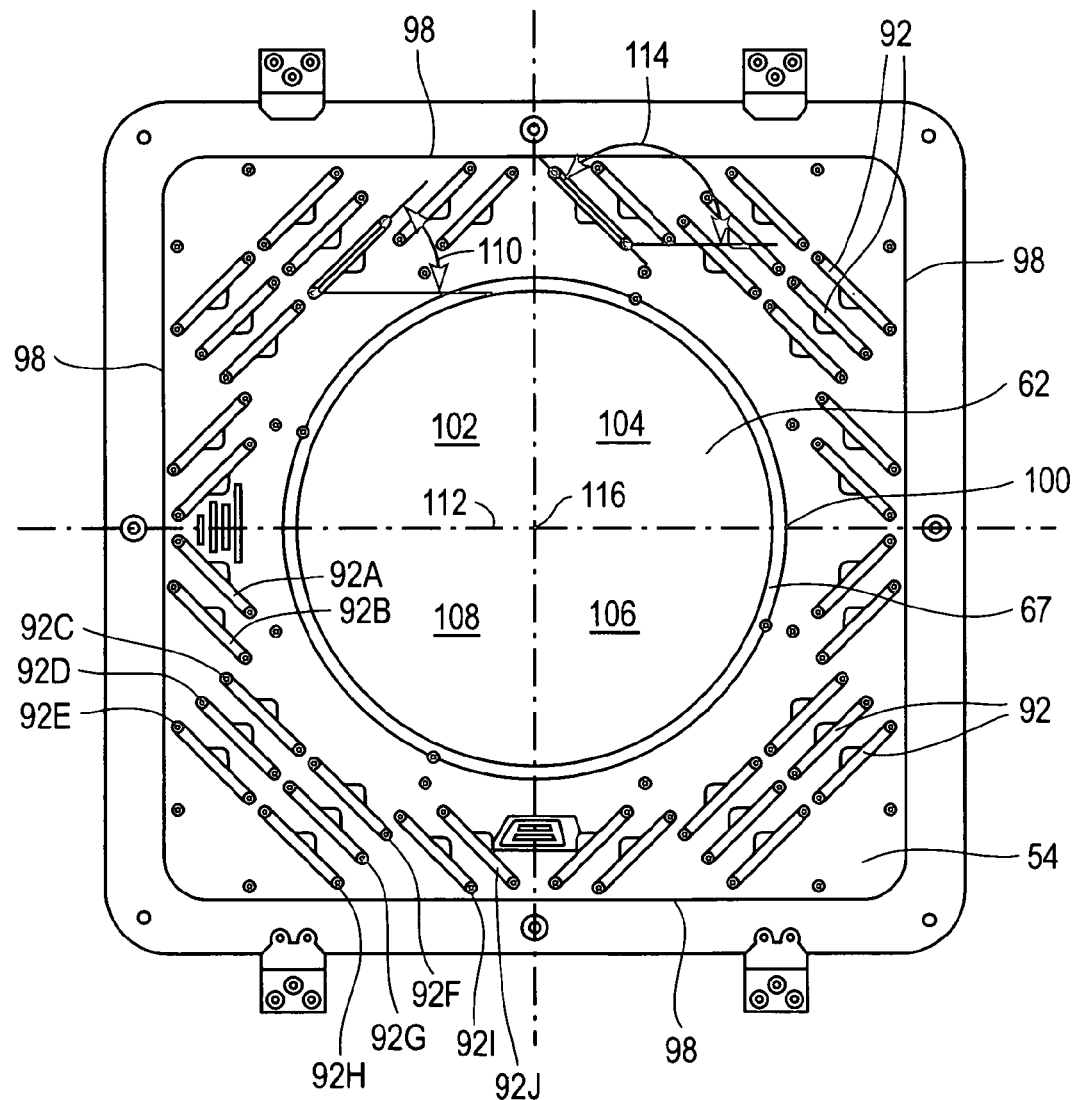
FIG. 6 is a bottom plan view of the contactor assembly of FIG. 5, particularly illustrating a layout of a plurality of interfaces of FIG. 5.

Referring to FIG. 6, the electrical distribution substrate 54 is square and has a periphery formed by four sides 98. The contactor substrate 62 has a circular periphery 100 within the four sides 98. A plurality of interfaces 92 such as the interface 92 of FIG. 5 are provided on an area of the electrical distribution substrate 54 outside the circular periphery 100. The locations and orientations of the interfaces 92 are selected to provide a relatively dense configuration. The combined length of all the interfaces 92 is more than the length of the circular periphery 100. The combined length of the interfaces 92 is also more than the combined length of the sides 98. The interfaces 92 in each respective quarter 102, 104, 106 and 108 are all aligned in the same direction.

The interfaces 92 of the juxtaposed quarters 102 and 106 are each at an angle 110 of 45 degrees relative to a centerline 112 through the distribution substrate 94. The interfaces of the juxtaposed quarters 104 and 108 are each at an angle 114 of 135 degrees relative to the centerline 112 as measured in the same direction as the angle 110.

Each one of the quarters 102, 104, 106 or 108 has ten of the interfaces 92A to 92J. The interfaces 92C, 92D, and 92E are parallel to one another but at different distances from a center point 116 of the contactor substrate 62. The interfaces 92F, 92G, and 92H are parallel to one another but at different distances from the center point 116. The interfaces 92C and 92F are in line with one another, as are the interfaces 92D and 92G and the interfaces 92E and 92H. The interfaces 92B and 92I are in line with one another but form a row that is closer to the center point 116 than the row formed by the interfaces 92C and 92F. The interfaces 92B and 92I are also spaced further from one another than the interfaces 92C and 92F. The interfaces 92A and 92J also form a row that is closer to the center point 116 than the row formed by the interfaces 92B and 92I.

Each one of the quarters 102, 104, 106, and 108 has an arrangement of ten of the interfaces 92 that is similar to the arrangement of interfaces 92A to 92J. The arrangement is rotated through 90 degrees about the center point 116 when moving from the quarter 108 to the quarter 102. Similarly, the arrangement is rotated through another 90 degrees when moving from the quarter 102 to the quarter 104, etc.

A respective flexible attachment 46 is connected to each respective one of the interfaces 92. The arrangement of the interfaces 92 allows for "fanning-in" or "fanning-out" of a large number of electrical paths to or from a relatively dense arrangement of the terminals 72 of the contactor board 50.

Referring again to FIG. 3, the cartridge frame 38 includes a lower backing plate 120, upper support pieces 122, and connecting pieces 124 that mount the upper support pieces 122 to the backing plate 120. The cartridge 18 further includes an actuator mechanism 126 for moving the contactor assembly 42 relatively with respect to the cartridge frame 38, and a travel sensor 128.

Figure 7:
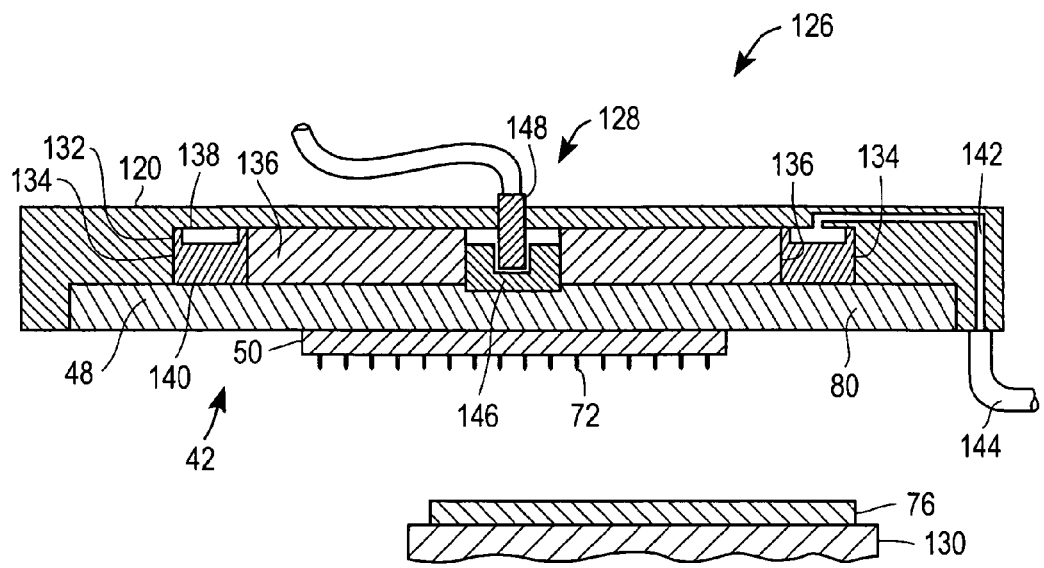
FIG. 7 is a cross-sectional side view of a portion of the cartridge of FIG. 3, particularly illustrating an actuator mechanism that is used to move the contactor assembly relative to a backing plate of a cartridge frame, and further illustrating a wafer holder that holds a wafer.

FIG. 7 illustrates the actuator mechanism 126, travel sensor 128, and a wafer holder 130 holding a wafer 76. A cylinder 132 is manufactured in the backing plate 120. The cylinder 132 has an outer surface 134 and an upper surface 138. A ring-shaped sliding piston 140 is inserted into the cylinder 132. A lower surface of the piston 140 is attached to the support structure 80. A fixed ring-shaped piston 136 is inserted into the center of the piston 140. An upper surface of the fixed ring-shaped piston 136 is attached to the backing plate 120. The support structure 80 is thus connected through the piston 140, fixed ring-shaped piston 136, and cylinder 132 of the actuator mechanism 126 to the backing plate 120. By locating the actuator mechanism 126 between the backing plate 120 and the support structure 80, the actuator mechanism 126 can move the contactor assembly 42 relatively with respect to the backing plate 120. A fluid passage 142 is manufactured in the backing plate 120. The fluid passage 142 extends from an external surface of the backing plate 120 to a location above an upper surface of the piston 140. A fluid line 144 is connected to the fluid passage 142. Pressurized air or a vacuum pressure can be provided through the fluid line 144 and fluid passage 142 to an upper surface of the piston 140.

The travel sensor 128 has an outer portion 146 attached to the support structure 80, and an inner portion 148 attached to the backing plate 120. Relative movement between the outer portion 146 and the inner portion 148 results in a change of inductance (or capacitance) between the outer portion 146 and the inner portion 148. The inductance (or capacitance) can be measured to provide an indication of how far the outer portion 146 travels with respect to the inner portion 148. The outer portion 146 fits within a circular opening in the backing plate, and the outer portion 146 additionally serves as a guide for movement of the contactor assembly 42 relative to the backing plate 120.

The wafer holder 130 forms part of the probing subassembly 16 illustrated in FIGS. 1 and 2. The wafer holder 130 is mounted for movement in horizontal x- and y-directions and movement in a vertical z-direction to the prober base portion 26 of FIGS. 1 and 2.

Figure 8:
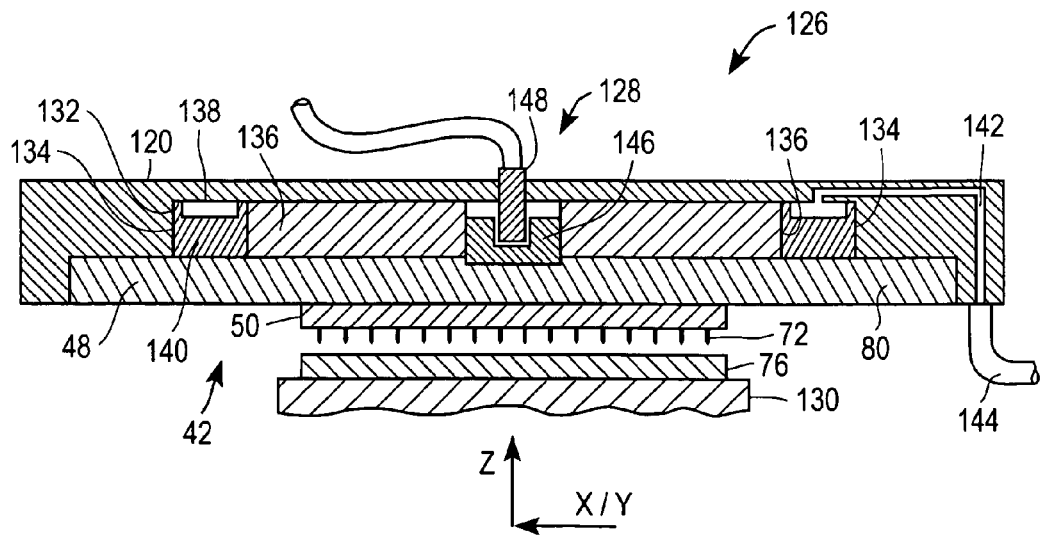
FIG. 8 is a view similar to FIG. 7, after the wafer holder has moved the wafer in to a position below terminals of the contactor assembly.

As illustrated in FIG. 8, the wafer holder 130 with the wafer 76 thereon is moved in x- and y-directions until the wafer 76 is directly below the contactor board 50. The wafer holder 130 is then moved vertically upwardly in a z-direction towards the contactor board 50. Each one of the terminals 72 is aligned with a respective one of the contacts on the wafer 76. The terminals 72, however, do not at this stage touch the contacts on the wafer 76.

Figure 9:
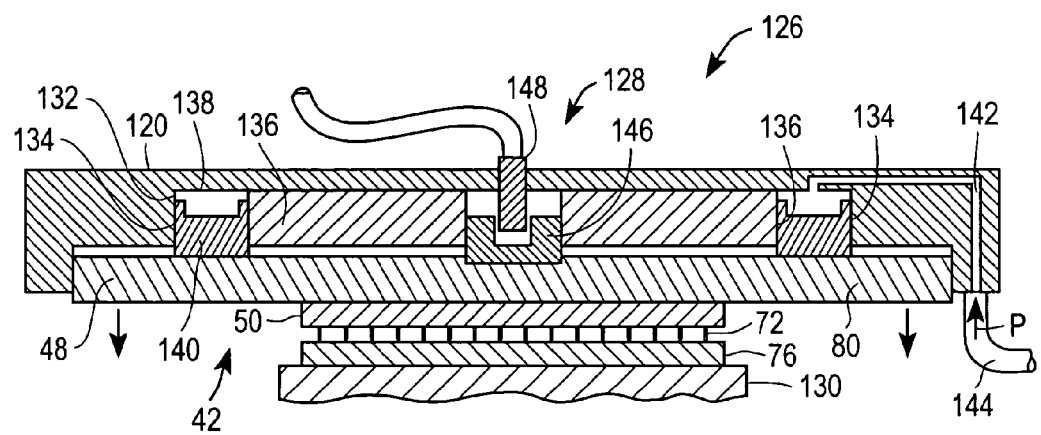
FIG. 9 is a view similar to FIG. 8, after the actuator mechanism is used to move the terminals into contact with contacts on the wafer.

As shown in FIG. 9, the actuator mechanism 126 is used to bring the terminals 72 into contact with the contacts on the wafer 76. Pressurized air is provided though the fluid line 144 and the fluid passage 142 into a volume defined by the surfaces 134 and 138 of the cylinder 132, an outer surface of the fixed ring-shaped piston 136, and an upper surface of the piston 140. The pressurized air acts on the upper surface of the piston 140 so that the piston 140 is moved downward relative to the backing plate 120. The piston 140 also moves the contactor assembly 42 downward until the terminals 72 come into contact with the contacts on the wafer 76. The terminals 72 are resiliently depressible against spring forces of the pins that they form part of. The spring forces jointly serve to counteract a force created by the pressure on the piston 140.

Figure 10:
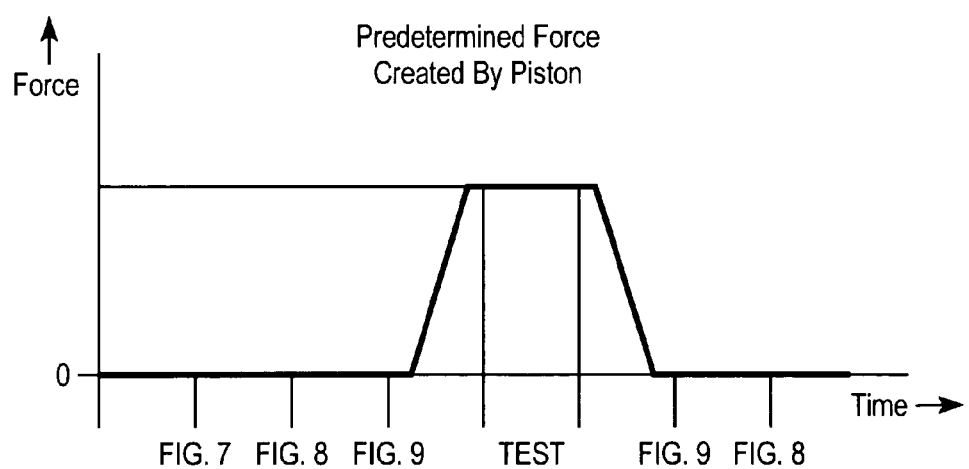
FIG. 10 is a time chart illustrating a force that is created by a piston of the actuator mechanism.

FIG. 10 shows the force that is created by the piston 140. No force acts on the terminals in FIGS. 7 and 8. In FIG. 9, the force is increased from zero to a predetermined force. This predetermined force can be calculated by multiplying the pressure and the area of the upper surface of the piston 140. The forces created by the terminals 72 are highly controllable because the pressure is highly controllable. The predetermined maximum force can easily be modified from one application to another. When the forces are applied by the terminals 72, electric signals, power, and ground are provided through the terminals 72 to and from the wafer 76. Integrated circuits on the wafer 76 are thereby tested. Once testing is completed, the pressure is relieved so that the forces exercised by the terminals 72 are again reduced to zero. A negative pressure is then applied, which moves the contactor assembly 42 away from the wafer 76 into the position shown in FIG. 8. The wafer 76 is then removed by the wafer holder 130 and the wafer 76 is replaced with another wafer on the wafer holder 130.

It will be appreciated that the order and speed of moving the wafer holder 130 relative to the contactor board 50 actuating the actuator mechanism 126 to bring the terminals 72 into contact with the contacts of the wafer 76 can be varied. Differing contact algorithms can be used to move the wafer holder 130 and actuate the actuator mechanism 126 to achieve optimal contact (e.g., good electrical contact, least pad damage, etc.) for different types of wafers.

The travel sensor 128 allows the pressure of the piston 140 to be set so that the piston 140 is roughly in the middle of its stroke when it contacts the wafer 76. Wafers having differing contactor technologies and/or number of contact points may be used with the apparatus 10. Different contact technologies often require a different force per pin to ensure wafer contact, and may also have different contactor heights. A different total force may be required to be applied to the contactor to make good contact with the wafer 76. The travel sensor 128 can be used to measure the distance the piston 140 has extended the contactor towards the wafer 76 under test. Thus, wafers having these varying types of contactors can be tested using the same apparatus 10.

Figure 11:
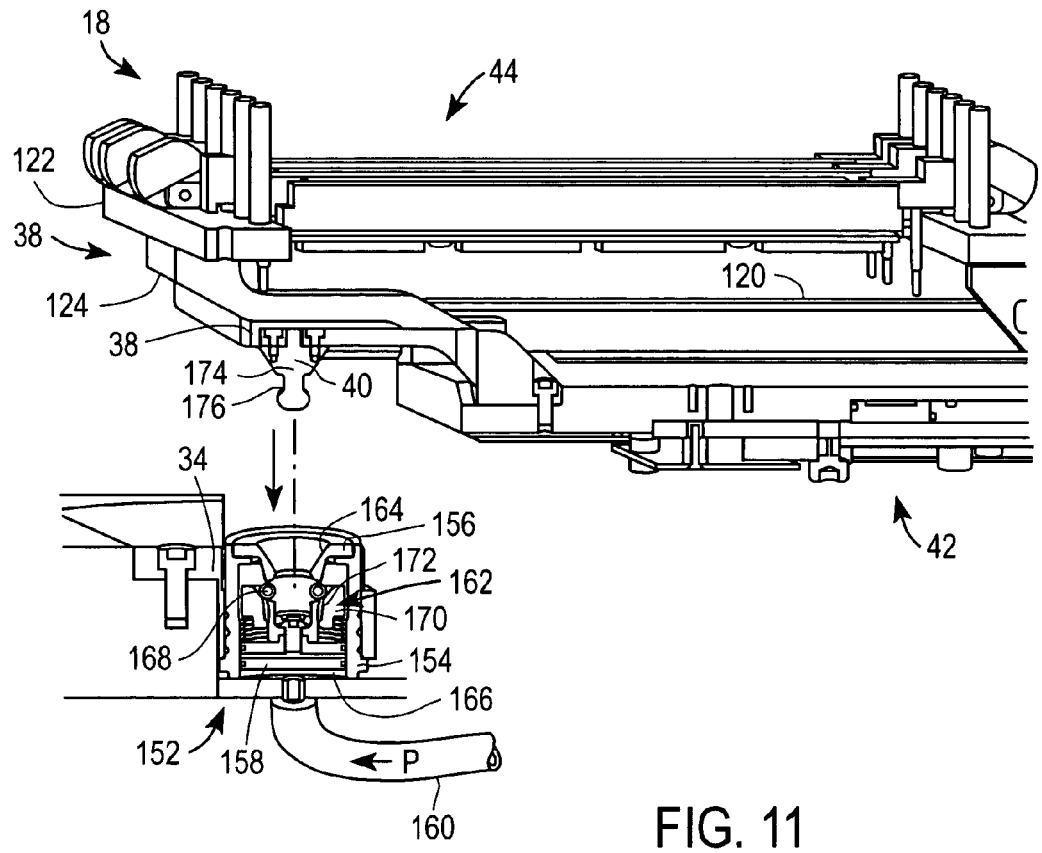
FIG. 11 is a cross-sectional side view particularly illustrating one alignment and locking formation of the cartridge of FIG. 3 and one alignment and locking mechanism secured to an upper portion of a base of a frame of the apparatus shown in FIGS. 1 and 2.

FIG. 11 illustrates an alignment and locking mechanism 152 mounted to the upper portion 34 of the frame 12 in FIGS. 1 and 2, and one of the alignment pins 40 mounted to the cartridge frame 38.

The alignment and locking mechanism 152 includes an outer sleeve 154, an alignment piece 156, a piston 158, a fluid line 160, and a locking actuator 162.

The alignment piece 156 has an alignment opening 164 formed therein. The alignment opening 164 has a conical shape so that an upper horizontal cross-section thereof is larger than a lower cross-section thereof. The alignment piece 156 is mounted to an upper end of the outer sleeve 154 and extends downwardly into the outer sleeve 154.

The piston 158 is located within a lower portion of the outer sleeve 154 and can slide up and down within the outer sleeve 154. A cavity 166 is defined within the outer sleeve 154 and by a lower surface of the piston 158. The fluid line 160 is connected to the cavity 166. Positive and negative pressure can be provided through the fluid line 160 to the cavity 166. Positive pressure causes upward movement of the piston 158, and negative pressure causes the piston 158 to move down.

The locking actuator 162 has a plurality of spherical locking members 168 and a locking actuator 170. The locking actuator 170 is mounted to the piston 158 so that it can move vertically up and down together with the piston 158. The locking actuator 170 has an internal surface 172 that makes contact with the spherical locking members 168. The surface 172 is conical so that movement of the locking actuator 170 between raised and lowered positions causes corresponding movement of the spherical locking members 168 toward and away from one another.

The formation 40 includes a positioning pin 174 with a recessed formation 176 formed at a location distant from an end of the positioning pin 174. The cartridge frame 38 is moved so that the positioning pin 174 is roughly located over the alignment opening 164. When the cartridge frame 38 is lowered into the position shown in FIG. 11, an end of the slightly misaligned positioning pin 174 can slide on a surface of the alignment opening 164 so that a center line of the positioning pin 174 moves towards a center line of the alignment opening 164. The piston 158 and the locking actuator 162 are in a lowered position to allow for movement of a larger end of the positioning pin 174 through an opening defined by the spherical locking members 168.

Figure 12:
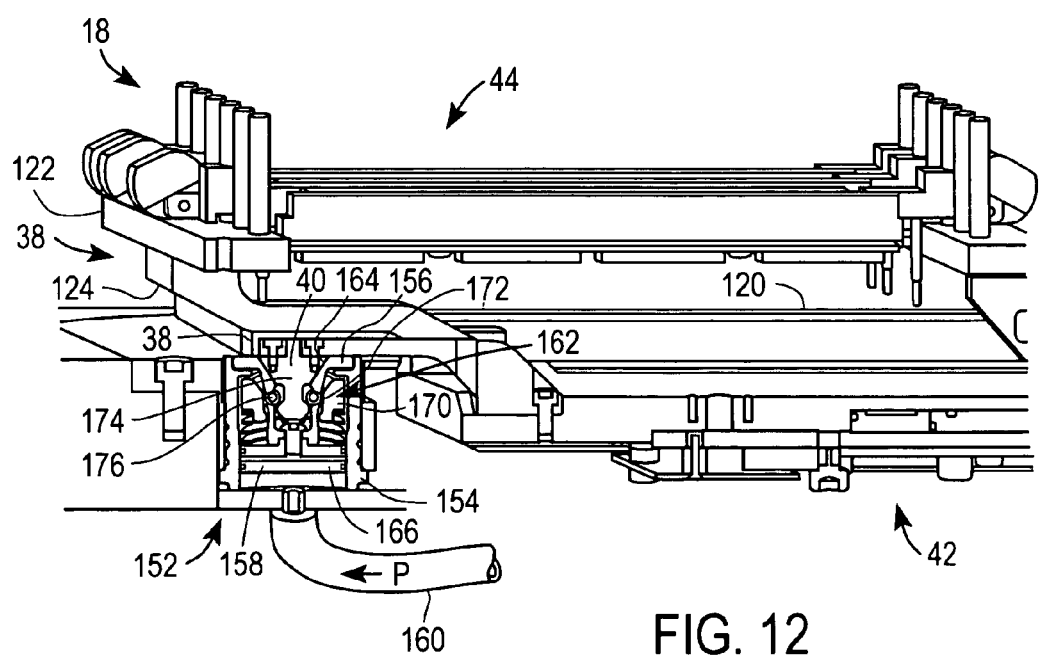
FIG. 12 is a view similar to FIG. 11, after the alignment and locking mechanism is used to align the formation, and the formation is removably engaged with the alignment and locking mechanism.

FIG. 12 illustrates the components of FIG. 11 after the formation 40 is lowered all the way and engaged with the alignment and locking mechanism 152. A conical surface on the formation 40 contacts the conical surface of the alignment opening 164, thereby further promoting correct alignment of the center lines of the positioning pin 174 and the alignment opening 164. The recessed formation 176 on the positioning pin 174 is now at the same elevation as the spherical locking members 168. The piston 158 and the locking actuator 170 are elevated so that the spherical locking members 168 engage with the recessed formation 176. The positioning pin 174 is thereby engaged with the spherical locking members 168 of the alignment and locking mechanism 152.

The positioning pin 174 can be released from the alignment and locking mechanism 152 by first lowering the piston 158 so that the spherical locking members 168 disengage from the recessed formation 176, and then lifting the cartridge frame 38 together with the positioning pin 174 out of the alignment opening 164. It may from time to time be required that a cartridge 18 be temporarily removed for purposes of maintenance or reconfiguration, or be replaced with another cartridge. The formation 40 and the alignment and locking mechanism 152 allow for quick removal and replacement of cartridges.

FIG. 3 illustrates one and a piece of the alignment pins 40. Only piece of the cartridge 18 is illustrated in FIG. 3 and the entire cartridge is in fact symmetrical about the section through one of the alignment pins 40. The other piece of the sectioned formation 40 and another one of the formations are not shown. There are thus a total of three of the alignment pins 40 respectively at corners of a triangle. Each one of the alignment pins 40 engages with a corresponding alignment and locking mechanism 152. The three alignment and locking mechanisms 152 are all simultaneously and remotely actuable from a common pressure source connected to corresponding fluid lines 160, to cause simultaneous engagement or disengagement of all three locking alignment pins 40.

As previously mentioned, with reference to FIGS. 1 and 2, the test head 20 can be moved to the position shown in FIG. 2 for purposes of maintenance to the cartridge 18. The cartridge 18 can also be replaced as discussed with reference to FIGS. 11 and 12. Following maintenance and/or replacement of the cartridge 18, the test head 20 is pivoted onto the cartridge into the position shown in FIG. 1.

Figure 13:
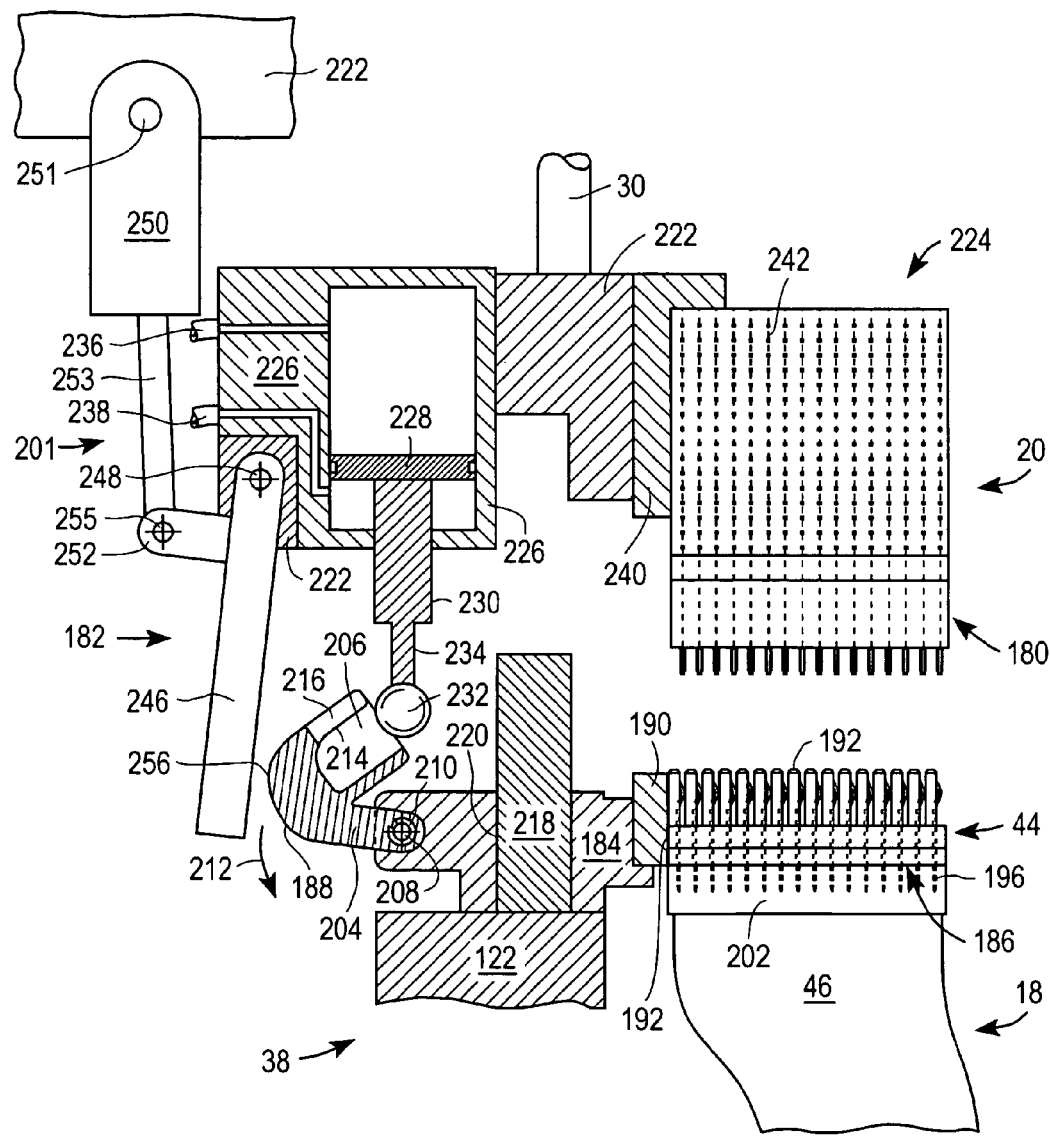
FIG. 13 is a cross-sectional side view particularly illustrating one first connector set of the cartridge of FIG. 3, one second connector set secured to a hinge portion of the frame of the apparatus of FIGS. 1 and 2.

FIG. 13 illustrates portions of the test head and cartridge 18 after the test head 20 is moved down onto the cartridge 18, i.e., from the position shown in FIG. 2 into the position shown in FIG. 1. The test head 20 has a second connector set 180 and an engager 182 mounted to the test head frame portion 30 of the frame 12 of FIG. 1. The second connector set 180 is initially disengaged from one of the first connector sets 44 of the cartridge 18.

The first connector set 44 includes a connector block support piece 184, a first connector module 186, and a first engagement component 188.

Figure 14:
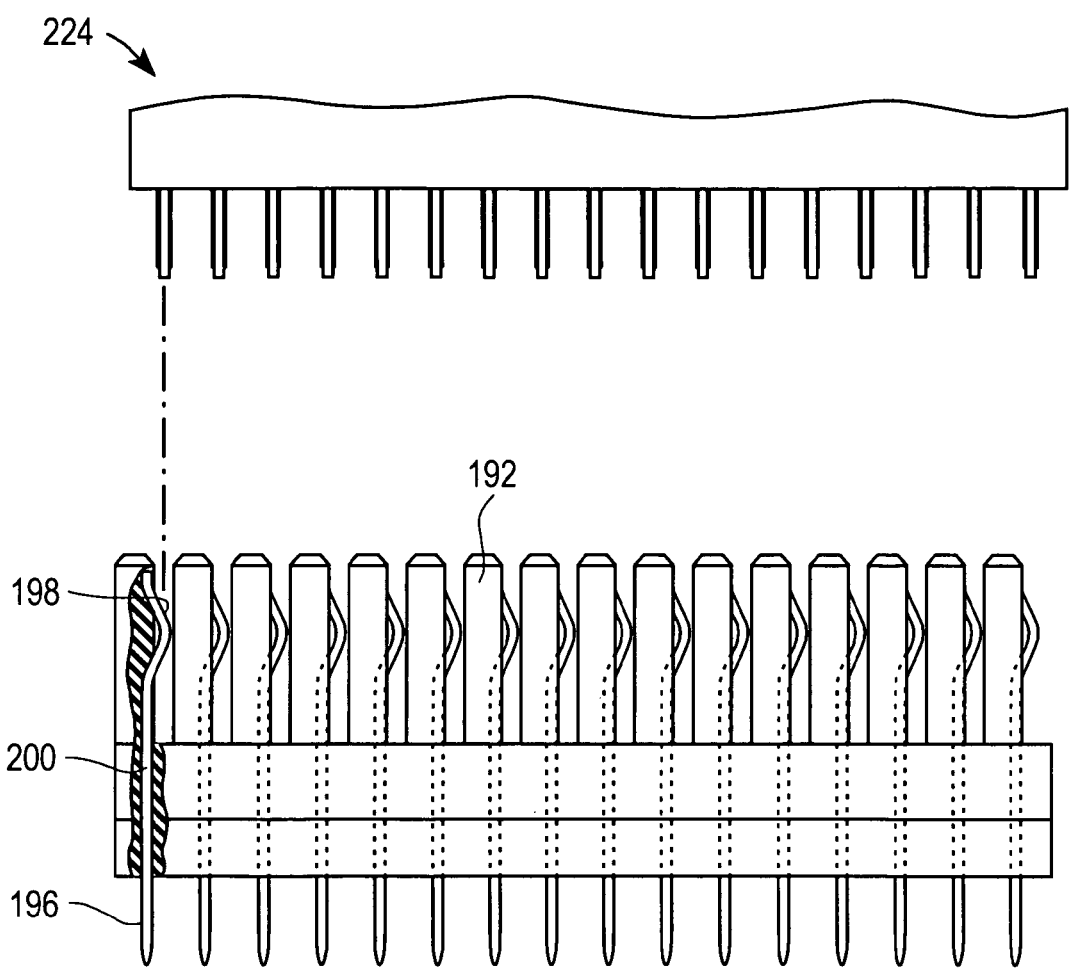
FIG. 14 is partially cross-sectioned side view illustrating a first connector module forming part of the first connector set of FIG. 13.

The first connector module 186 includes a first connector block 190 and a plurality of septa 192. The septa 192 are held in a side-by-side relationship by the first connector block 190. FIG. 14 illustrates one of the septa 192 in more detail. A plurality of conductors is formed behind one another into the paper against each septum 192. Each conductor includes a terminal 196 at a lower edge of the septum 192, a contact 198 at an upper edge of the septum 192, and an electrically conductive lead 200 interconnecting the terminal 196 with the contact 198.

Referring again to FIG. 13, a number of the flexible attachments 46 are attached through respective connectors 202 to the terminals 196 of FIG. 14. The septa 192 provide for a dense arrangement of the terminals 196 and contacts 198 held by the first connector block 190.

The first connector module 186 is inserted into the connector block support piece 184 with the first connector block 190 contacting an inner portion of the connector block support piece 184. The first connector module 186 is then secured to the connector block support piece 184 by releasable means so as to again allow for removal of the first connector module 186 from the connector block support piece 184.

The first engagement component 188 has inner and outer portions 204 and 206 respectively. The inner portion 204 is mounted to an outer portion of the connector block support piece 184 for pivotal movement about a horizontal axis 208. A spring 210 biases the first engagement component 188 in a counter-clockwise direction 212. The outer portion 206 has a spherical inner engagement surface 214 and a groove 216 as formed into the engagement surface 214.

A slider pin 218 is secured to and extends vertically upwardly from one of the upper support pieces 122 of the cartridge frame 38. A complementary slider opening 220 is formed vertically through the connector block support piece 184. The slider opening 220 is positioned over the slider pin 218, and the first connector set 44 is moved down until the connector block support piece 184 rests on the upper support piece 122. The first connector set 44 is thereby held by the slider pin 218 of the cartridge frame 38 and prevented from movement in horizontal x- and y-directions. The first connector set 44 can still be removed from the cartridge frame 38 by lifting the first connector set 44 out of the slider pin 218, for purposes of maintenance or reconfiguration.

The second connector set 180 includes a subframe 222, a second connector module 224, a cylinder 226, a piston 228, a rod 230, a spherical engager 232, a connecting piece 234, and first and second supply lines 236 and 238 respectively.

The subframe 222 is mounted to the test head frame portion 30. The second connector set 180 is mounted through the subframe 222 to the test head frame portion 30. The second connector set 180 has a second connector block 240 and a plurality of printed circuit boards 242 mounted in a side-by-side relationship to the second connector block 240. Each one of the printed circuit boards 242 has a respective substrate, terminals on a lower edge of the substrate, contacts at an upper edge of the substrate, and electrically conductive traces, each connecting a respective terminal with a respective contact. The second connector block 240 is releasably held within the subframe 222 and secured to the subframe 222 with releasable means.

The cylinder 226 is secured to the subframe 222. The piston 228 is located within the cylinder 226 and is movable in vertically upward and downward directions within the cylinder 226. First and second cavities are defined within the cylinder 226 respectively above and below the piston 228, and the first and second supply lines 236 and 238 are connected to the first and second cavities, respectively.

An upper end of the rod 230 is secured to a piston 228. The rod 230 extends downwardly from the piston 228 through an opening in a base of the cylinder 226. The spherical engager 232 is secured via the connecting piece 234 to a lower end of the rod 230. The connecting piece 234 has a smaller diameter than either the rod 230 or the spherical engager 232.

The engager 182 includes a plate 246 that is mounted to the subframe 222 for pivotal movement about a horizontal axis 248, an actuator assembly 201, and a link mechanism 252 connecting the plate 246 to the actuator assembly 201. The actuator assembly 201 includes an actuator 250, a connecting rod 253, an actuator pivot 251, and a rod pivot 255.

As previously mentioned, the second connector set 180 is initially disengaged from the first connector set 44. The second connector module 224 is thus disengaged from the first connector module 186 and the spherical engager 232 is also disengaged from the first engagement component 188. Pressurized air is provided through the first supply line 236 while air is vented from the second supply line 238, so that the piston 228 moves in a downward direction within the cylinder 226. Downward movement of the piston 228 extends the rod 230 further out of the cylinder 226 and moves the spherical engager 232 closer to the cartridge 18.

Figure 15:
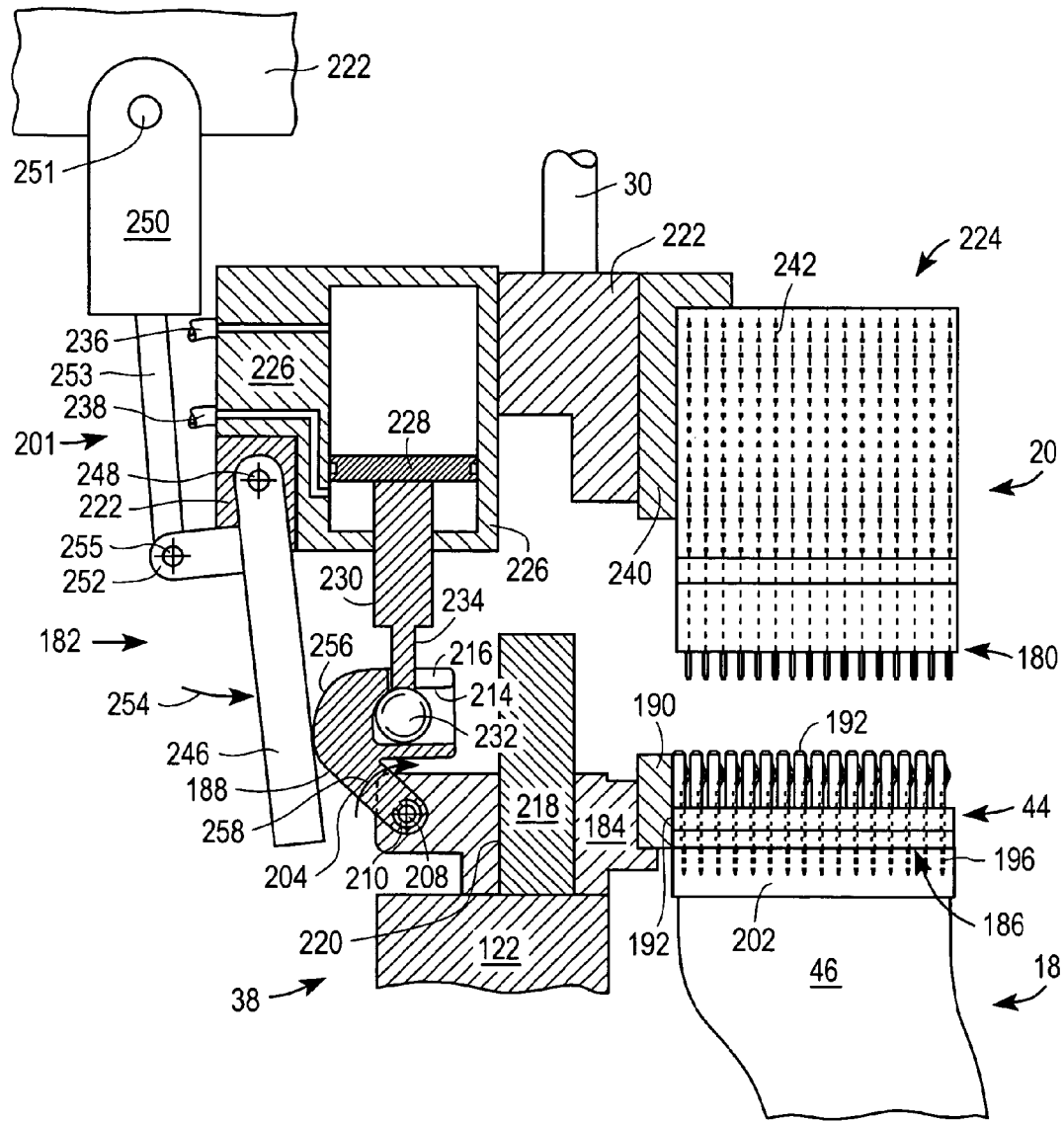
FIG. 15 is a view similar to FIG. 13, after an engager is used to rotate a spherical inner engagement surface of a first engagement component forming part of the first connector set over a spherical engager forming part of a second connector set.

As illustrated in FIG. 15, the actuator assembly 201 is operated so that the link mechanism 252 moves the plate 246 in a counterclockwise direction 254. The plate 246 comes into contact with an outer surface 256 of the first engagement component 188. Further movement of the plate 246 rotates the first engagement component 188 in a clockwise direction 258 and in a camming action. A fork defined by the groove 216 moves over the connecting piece 234, and the engagement surface 214 moves into a position over at the spherical engager 232.

Figure 16:
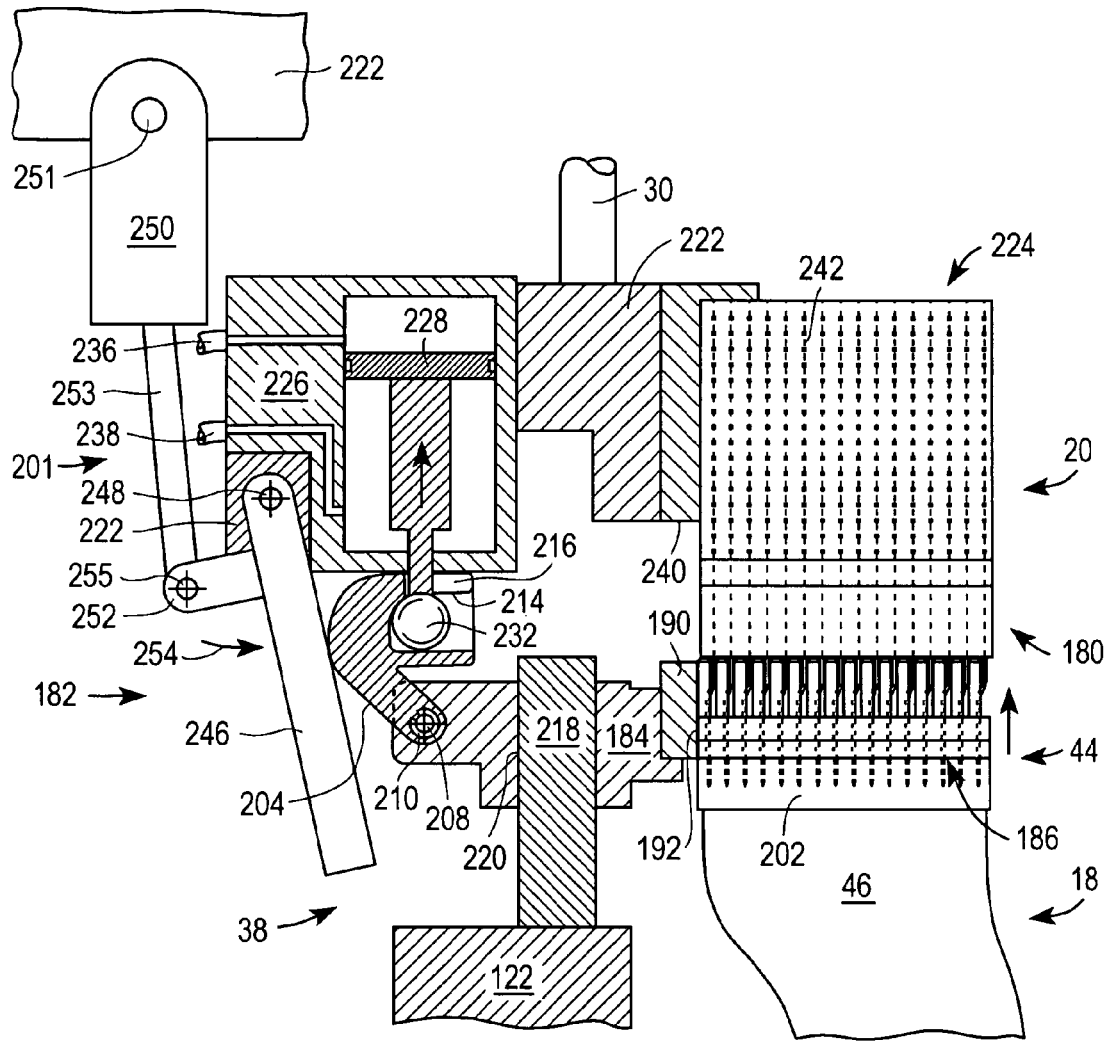
FIG. 16 is a view similar to FIG. 15, after engagement of the first connector set with the second connector set.

As illustrated in FIG. 16, pressurized air is provided through the second supply line 238, and air is vented through the first supply line 236 so that the piston 228 moves in a vertically upward direction. The rod 230 retracts in an upward direction into the cylinder 226. An upper surface of the spherical engager 232 engages with the engagement surface 214 and moves the first engagement component 188 towards the cylinder 226. The first connector set 44 lifts off the upper support piece 122 of the cartridge frame 38, and the connector block support piece 184 slides up the slider pin 218.

The pressurized air provided through the second supply line 238 also creates a force that is sufficiently large to overcome an insertion force required to mate the first connector module 186 with the second connector module 224. Each one of the septa 192 enters into a gap between two of the printed circuit boards 242. Gaps between the contacts 198 on the septa 192 and the gaps between the printed circuit boards 242 are sufficiently small so that an interference fit is required to insert the septa 192 between the printed circuit boards 242. Once the insertion force is overcome and the septa 192 are located between the printed circuit boards 242, each one of the contacts 198 is located against a corresponding terminal on a lower edge of one of the printed circuit boards 242.

The pressurized air provided through the second supply line 238 can be removed after the first and second connector modules 186 and 224 are mated. The first and second connector modules 186 and 224 can be disengaged from one another by providing pressurized air through the first supply line 236 so that the first connector set 44 moves into the position as shown in FIG. 15. The actuator assembly 201 is then operated and the plate 246 moves into the position shown in FIG. 13. The spring 210 biases the first engagement component 188 in the counterclockwise direction 212 away from the spherical engager 232. The rod 230 is then typically again retracted into the cylinder 226.

Figure 17:
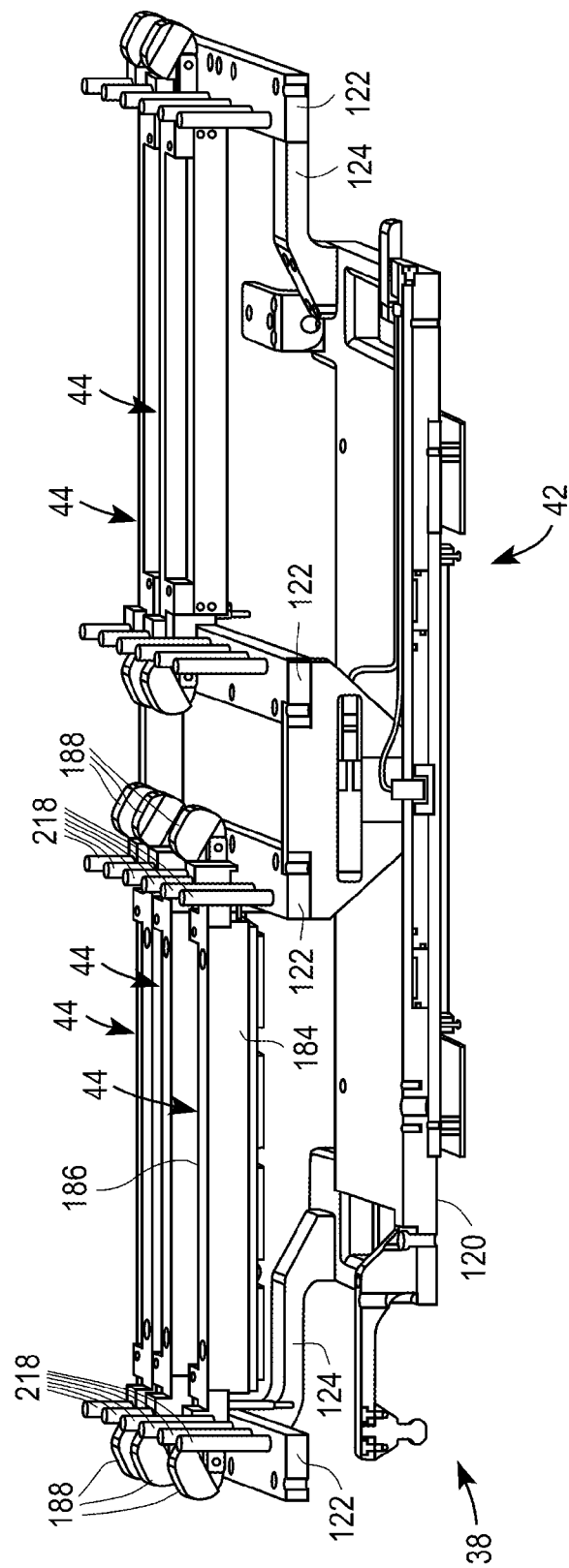
FIG. 17 is a perspective view of the cartridge of FIG. 3, specifically illustrating the layout and configuration of a plurality of first connector sets of FIG. 13.

As illustrated in FIG. 17, cartridge 38 has four of the upper support pieces 122, and a respective pair of the upper support pieces 122 carries a respective column of the first connector sets 44. The columns are located next to one another so that a respective pair of the first connector sets 44 is in a respective row. There can be a total of 16 rows in each of the two columns, thus potentially forming an array of 32 of the first connector sets 44.

Each one of the first connector sets 44 is symmetrical on the left and the right. The connector block support piece 184 entirely surrounds the first connector module 186, and two slider openings (220 in FIG. 13) are provided at opposing ends of the connector block support piece 184. Slider pins 218 are provided on all four of the upper support pieces 122, and each respective connector block support piece 184 has two slider openings 220 respectively located over two of the slider pins 218.

Figure 18:
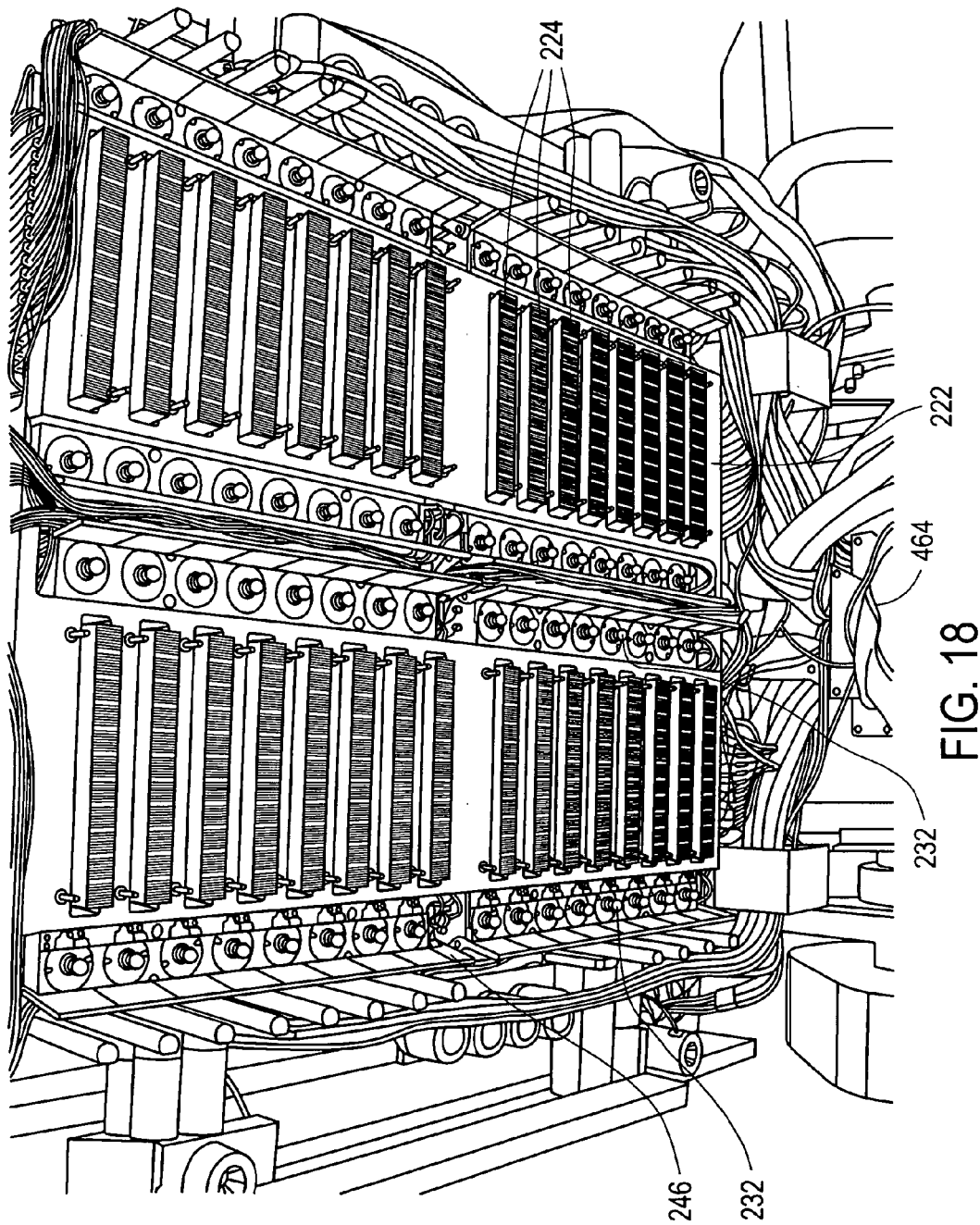
FIG. 18 is a perspective view from below illustrating a layout of a plurality of second connector sets of FIG. 13.

As shown in FIG. 18, an array of second connector modules 224 is provided, matching the array of first connector modules 186 of FIG. 17. Two spherical engagers 232 are located on opposing sides of each one of the second connector modules 224. In use, a respective pair of spherical engagers 232 is used to engage one of the first connector modules 186 with one of the second connector modules 224 independently of the other connector modules. One of the first connector modules 186 is engaged with one of the second connector modules 224, where after another one of the first connector modules 186 is engaged with another one of the second connector modules 224, etc. By staggering the engagement of a respective first connector module 186 with a respective second connector module 224, forces on the subframe 222 and other pieces of the frame 12 of FIG. 1 can be kept within their design parameters.

Each one of the plates 246 is located adjacent a plurality of the spherical engagers 232. Movement of a respective one of the plates 246 causes the respective plate 246 to contact an simultaneously pivot a plurality of the first engagement components 188 of FIG. 13 over a plurality of respective ones of the spherical engagers 232.

Figure 19:
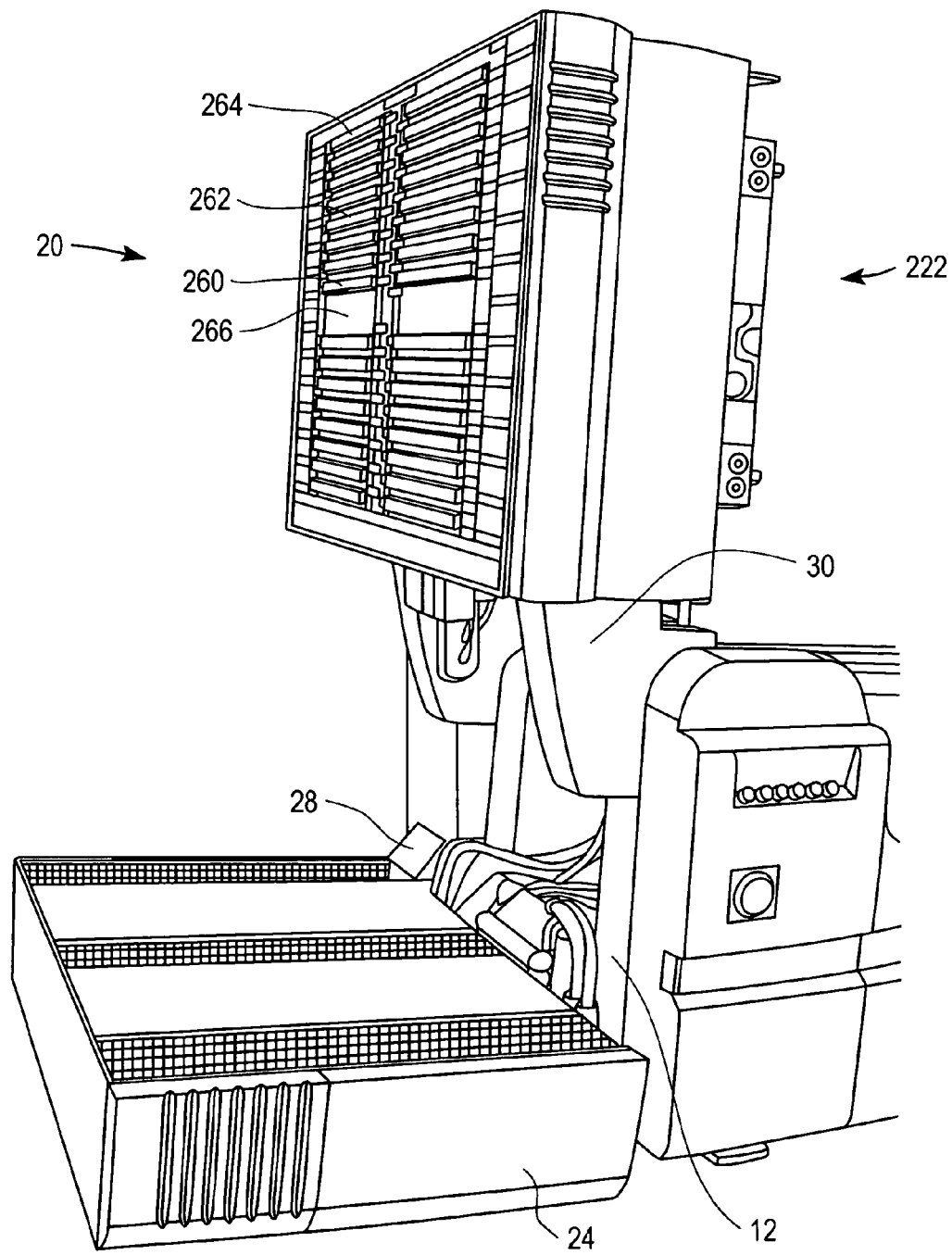
FIG. 19 is a perspective view of a portion of the apparatus shown in FIG. 2, wherein the thermal system frame portion is rotated approximately 135 degrees counterclockwise, and a test head frame portion is rotated approximately 90 degrees to the right.

Referring to FIGS. 18 and 19 in combination, each one of the second connector modules 224 is mounted to respective pattern generator, driver, and power boards, 260, 262, and 264 respectively, each residing in a respective slot of a base structure 266. As specifically shown in FIG. 19, access can be gained to the boards 260, 262, and 264 by rotating the thermal system frame portion 28 together with the test head frame portion 30 an additional 135 degrees counterclockwise to the left when compared to FIG. 2, and then rotating the test head frame portion 30 relative to the thermal system frame portion 28 90 degrees clockwise to the right. The thermal system 24 is then positioned on the ground and the test head 20 in a vertical orientation. The boards 260, 262, and 264 are all accessible from the left within the test head 20 because the test head 20 and the thermal system 24 have been separated from one another. The boards 260, 262, and 264 that reside in the slots of the base structure 266 are then removable, replaceable, and other boards can be added, for purposes of reconfiguration.

Figure 20:
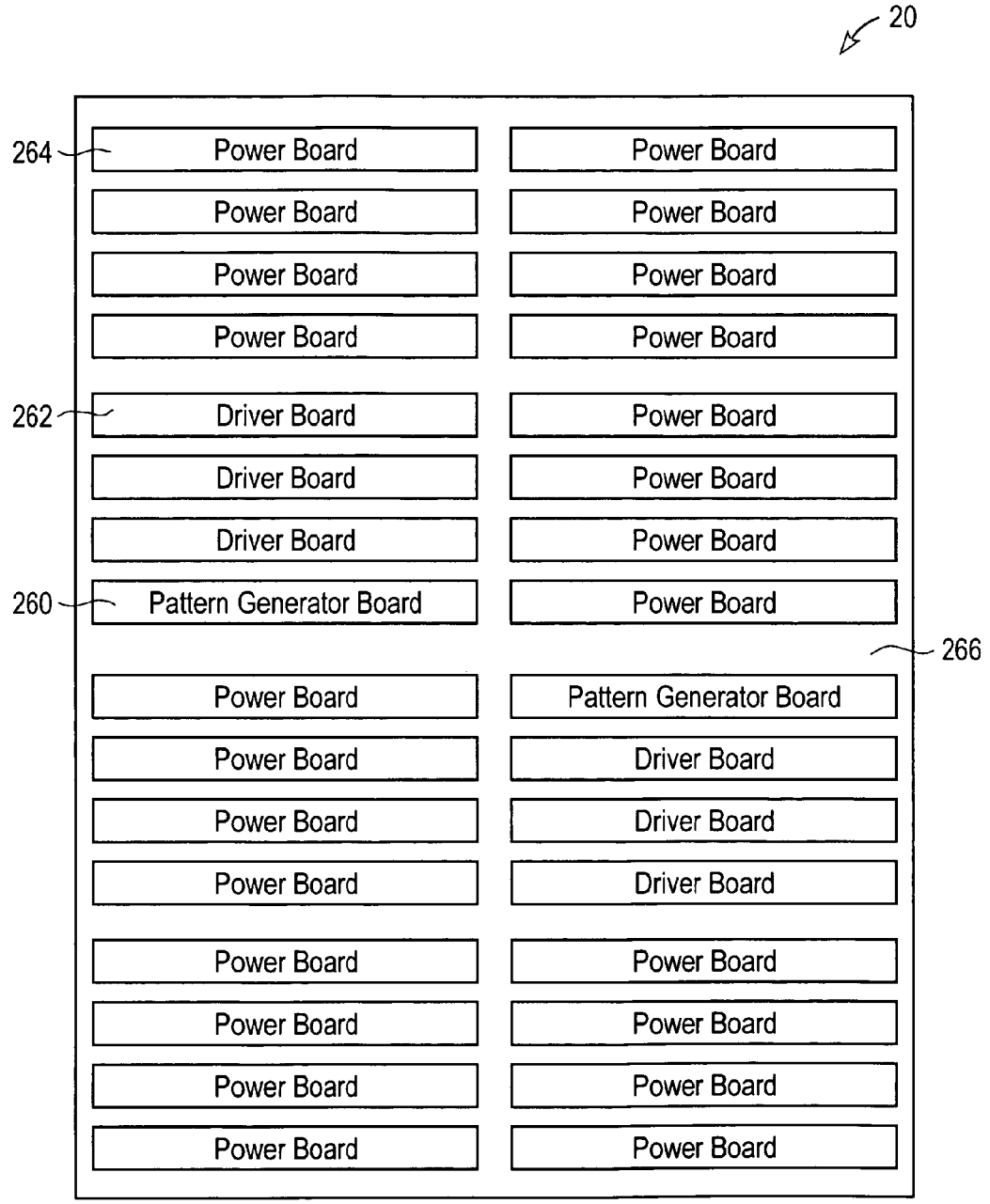
FIG. 20 is an end view illustrating in block diagram form the layout of power, driver, and pattern generator boards when viewed from the left in FIG. 19.

Each one of the slots can only carry one particular type of board 260, 262, or 264. The base structure 266 is configurable so that slots are configurable to allow for more or fewer of a particular board, or to modify the locations of particular boards. Once the slots are inserted, they are typically not replaced over the life of the apparatus 10. The number of boards 260, 262, and 264 that are used can still be configured from one application to the next. FIG. 20 illustrates an example of a layout of slots in the test head 20. The particular layout of slots of FIG. 20 allows for the use of two pattern generator boards 260, one on the left and one on the right; six driver boards 262, three on the left and three on the right; and 24 power boards 264, twelve on the left and twelve on the right.

After the boards 260, 262, and 264 are inserted into the slots as discussed with reference to FIGS. 19 and 20, the apparatus is first moved into the configuration illustrated in FIG. 2 with the thermal system 24 above the test head 20, and then into the configuration illustrated in FIG. 1, with the components of the test head 20 electrically connected to the components of the cartridge 18 in FIG. 2.

Referring specifically to FIG. 1, what should be noted is that the thermal system 24 does not rest on the test head 20. Any vibrations caused by components of the thermal system 24 can thus not be directly transferred to the test head 20. The test head 20 and the thermal system 24 are held in the relative orientation shown in FIG. 1 with the thermal system 24 above the test head 20 by the thermal system frame portion 28 and the test head frame portion 30, respectively, of the frame 12. The frame 12 is relatively heavy and has a rigid construction, and effectively dampens any vibrations created by components of the thermal system 24. The vibrations substantially do not reach the components of the test head 20.

Figure 21:
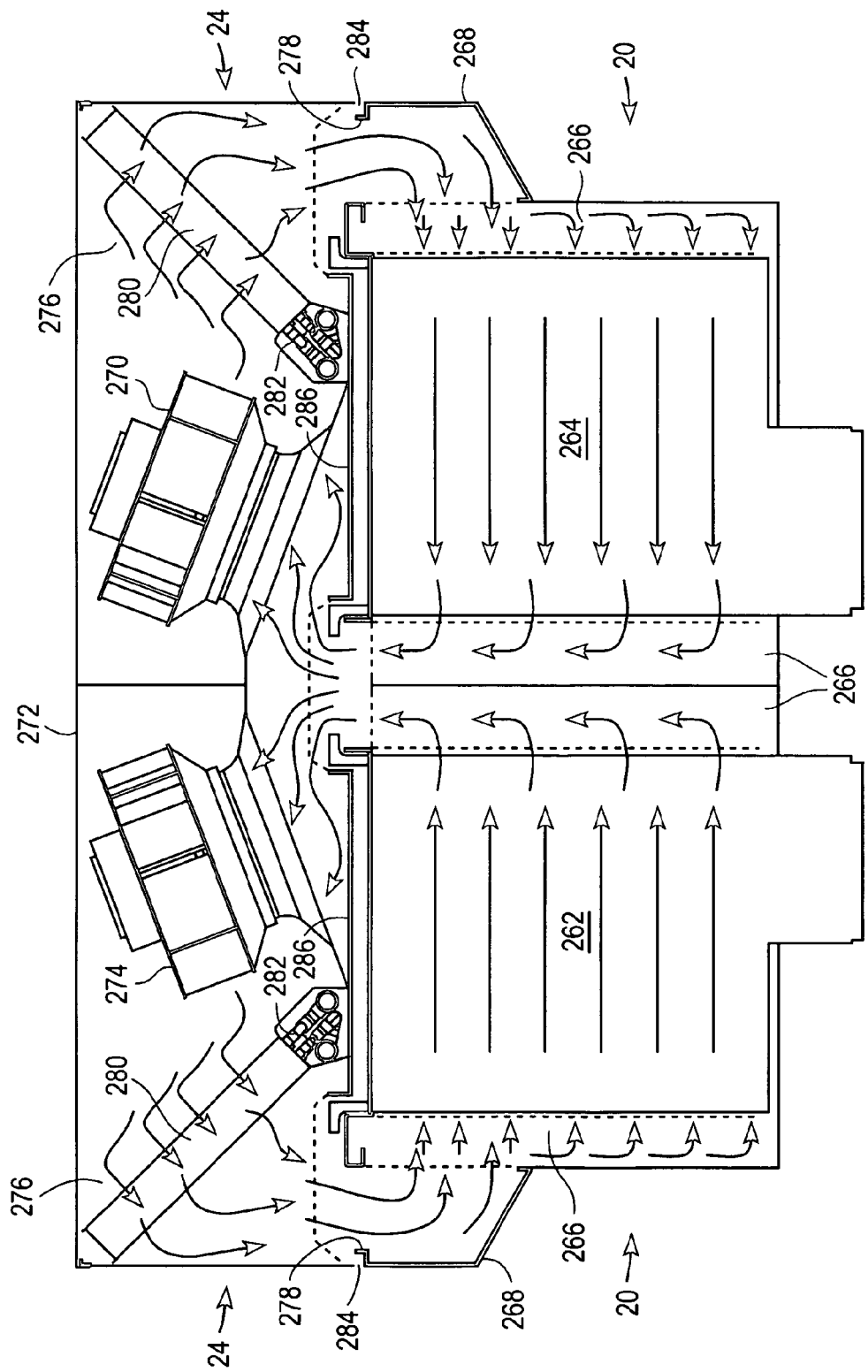
FIG. 21 is a cross-sectional side view parallel to two of the boards illustrated in FIG. 20, further illustrating a thermal system that is used to cool the boards.

FIG. 21 illustrates how the thermal system 24 cools components of the test head 20. FIG. 21 is a partial cross-sectional view parallel to a plane of one of the boards 260, 262, and 264 of FIG. 20, and shows one of the driver boards 262 and one of the power boards 264 inserted into their respective slots of the base structure 266 of the test head 20. The test head 20 further has two manifold panels 268 mounted on opposing sides and at upper portions of the base structure 266. The base structure 266 has openings between the slots that allow for air to flow from the manifold panels 268 inward to the boards 262 and 264, and then from the boards 262 and 264 to an upper end exhaust 270.

The thermal system 24 includes an outer shell 272, four recirculation fans 274 (only two of the recirculation fans 274 are shown in FIG. 21; the other two recirculation fans are located behind the recirculation fans 274 that are shown in FIG. 21), and two heat exchangers 276. The air leaving the upper end exhaust 270 is sucked through the recirculation fans 274 into the outer shell 272. Recirculation fans 274 then force the air through the heat exchangers 276, whereafter the air enters through upper end inlets 278 defined by the manifold panels 268. By recirculating the air, heat convects from the boards 262 and 264 to the heat exchangers 276. As is commonly known, each heat exchanger 276 includes a plurality of fins 280 and tubing 282 connecting the fins 280 to one another. A cooling fluid such as liquid water is pumped through the tubing 282. The heat convects to the fins 280. The heat conducts from the fins 280 to the tubing 282. The heat then convects from the tubing 282 to the water and is pumped away.

What should be noted is that there is no physical contact between any components of the thermal system 24 and any components of the test head 20. Only a small gap 284 is defined between the outer shell 272 and the manifold panel 268. A seal is typically located in the gap 284, and is made of a compliant material so that any vibrations transferred by the fan 274 to the outer shell 272 do not transfer to the manifold panels 268. Guide panels 286 form part of the thermal system 24, and serve to prevent the air from entering the test head 20 before first passing through the fans 274 and the heat exchangers 276.

Figure 22:
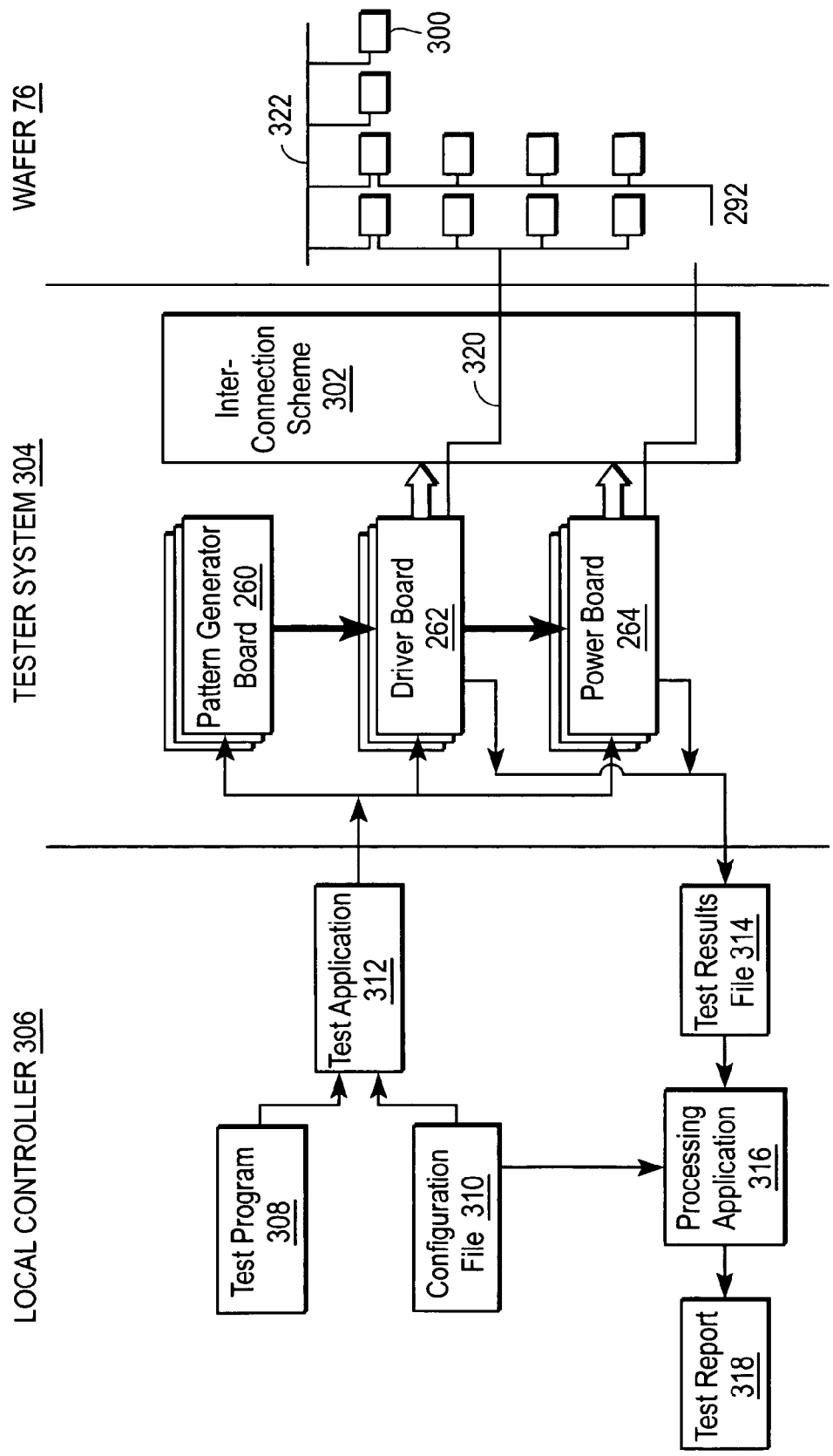
FIG. 22 is a block diagram of components of the apparatus of FIG. 1, further illustrating a computer system of the apparatus, the computer system holding a configuration file representing a configuration of a tester system of the apparatus.

FIG. 22 illustrates software and hardware components of the apparatus 10 of FIG. 1 that cooperate and that are matched to one another for fanning-out and fanning-in of electric signals, power, and ground. Zones are defined, wherein each zone includes one pattern generator board 260, one or more driver boards 262, and one or more power boards 264 connected to one another. Each board 260, 262, and 264 has a number of resources or channels. In particular, a driver board 262 has a number of input/output channels, and the power board 264 has a number of power channels. The number of boards 260, 262, and 264 and the way that they are connected to one another are configurable, depending on the requirements of integrated circuits of devices 300 and the layout of the devices 300 of the wafer 76.

An interconnection scheme 302 connects the driver and power boards 262 and 264 to contacts on the devices 300. The interconnection scheme 302 includes the electrical paths formed by conductors within the cartridge 18 of FIG. 3. The interconnection scheme 302 is also configurable, as will be appreciated from the foregoing description of the cartridge 18. The boards 260, 262, and 264 and the interconnection scheme 302 are hereinafter jointly referred to as a tester system 304.

A local controller 306 is used to provide test instructions to the tester system 304 and is then used to upload and process test results from the tester system 304. The local controller 306 has memory and, stored in the memory, are a test program 308, a configuration file 310, a test application 312, a test results file 314, a processing application 316, and a test report 318.

Figure 23:
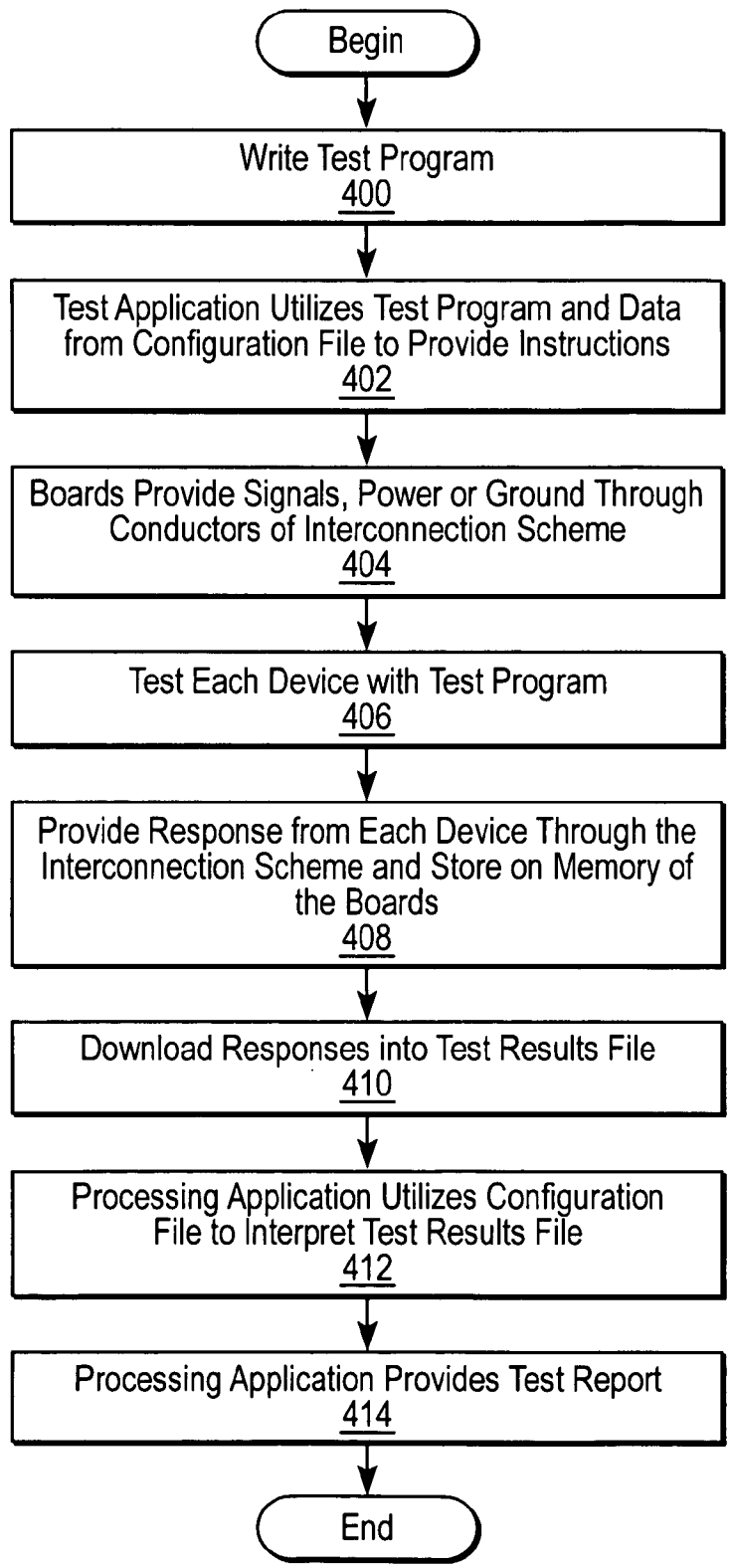
FIG. 23 is a flow chart of how the apparatus of FIG. 19 is used.

Reference should now be made to FIGS. 22 and 23 in combination. The test program 308 has a series of instructions written by a test programmer to test one of the devices 300 (step 400). The following is an extract of such a program:

setdps ("v NORMAL 1", "Vcc", 3.0 V, 0.0 V, 11.0 V);
    setdps ("v NORMAL 1", "Vcd", 4 V, 0.0 V, 11.0 V);
    setsps ("v NORMAL 1", "Vio", 0 V, 3.3 V);
    setsps ("v NORMAL 1", "Vclk", 0 V, 3.3 V);
    setsps ("v NORMAL 1", "Vcs", 0 V, 3.3 V);
    setpps ("v NORMAL 1", "Term 1", 1.0);
    settps ("v NORMAL 1", "Term 2", 1.0);
    setthps ("v NORMAL 1", "CompH", 1.5);
    setthps ("v NORMAL 1", "CompL", 0.9).

The test application 312 utilizes both of the test program 308 and data from the configuration file 310 and data from the test results file 314 to provide instructions to the boards 260, 262, and 264 (step 402). The boards 260, 262, and 264 then provide electric signals, power, or ground through respective conductors of the interconnection scheme 302 (step 404). The configuration file 310 has data representing a relationship between the channels of the boards 260, 262, and 264 and the contacts of the devices 300. The configuration file 310 will be different from one configuration assembly to another configuration assembly of the tester system 304. The configuration file 310 thus represents how the instructions of the test program 308 are fanned out through the tester system 304 to the devices 300. Each device 300 is tested with the same test program 308 (step 406), although the voltage and signal levels may be modified based upon the test result file 314.

The following table is an extract of the configuration file 310 with field names listed at the top of each column:

| ZONE NUMBER | SLOT NUMBER | CHANNEL TYPE | RAB NUMBER | PWR MODULE NUMBER | CHANNEL NUMBER | COLUMN | ROW | CONN TYPE | PAD LABEL | TERM LABEL | COMMON KEY | MASK |
|---|---|---|---|---|---|---|---|---|---|---|---|---|
| 2 | 29 | HVOL | 1 | 1 | 0 | 5 | 16 | D | CE | 0 | 0 | 0 |
| 2 | 22 | DRV_CS | −1 | −1 | 0 | 1 | 20 | D | OE | CS_0 | 0 | 0 |
| 1 | 6 | DRV_CS | −1 | −1 | 0 | 37 | 15 | D | OE | CS_0 | 0 | 0 |
| 1 | 6 | DRV_UCLK | −1 | −1 | 0 | 35 | 15 | D | DQ1 | A_0 | 0 | 0 |
| 2 | 22 | DRV_UCLK | −1 | −1 | 0 | 7 | 20 | D | DQ1 | A_0 | 0 | 0 |
| 2 | 22 | DRV_UCLK | −1 | −1 | 1 | 20 | 25 | D | DQ1 | B_1 | 0 | 0 |
| 2 | 22 | DRV_IO | −1 | −1 | 1 | 2 | 21 | D | DQ7 | I/O_1 | 0 | 0 |
| 1 | 6 | DRV_UCLK | −1 | −1 | 1 | 15 | 10 | D | DQ1 | B_1 | 0 | 0 |
| 2 | 22 | DRV_CS | −1 | −1 | 1 | 3 | 21 | D | OE | CS_1 | 0 | 0 |
| 1 | 6 | DRV_CS | −1 | −1 | 1 | 32 | 14 | D | OE | CS_1 | 0 | 0 |
| 1 | 6 | DRV_UCLK | −1 | −1 | 1 | 15 | 2 | D | DQ1 | B_1 | 0 | 0 |
| 1 | 6 | DRV_UCLK | −1 | −1 | 1 | 17 | 14 | D | DQ1 | B_1 | 0 | 0 |
| 1 | 6 | DRV_IO | −1 | −1 | 1 | 37 | 13 | D | DQ7 | I/O_1 | 0 | 0 |
| 1 | 6 | DRV_CS | −1 | −1 | 1 | 28 | 6 | D | OE | CS_1 | 0 | 0 |
| 1 | 6 | DRV_UCLK | −1 | −1 | 1 | 16 | 14 | D | DQ1 | B_1 | 0 | 0 |
| 2 | 22 | DRV_UCLK | −1 | −1 | 1 | 6 | 25 | D | DQ1 | A_1 | 0 | 0 |
| 2 | 22 | DRV_CS | −1 | −1 | 1 | 10 | 17 | D | OE | CS_1 | 0 | 0 |
| 2 | 22 | DRV_CS | −1 | −1 | 1 | 11 | 21 | D | OE | CS_1 | 0 | 0 |
| 2 | 22 | DRV_UCLK | −1 | −1 | 1 | 21 | 21 | D | DQ1 | B_1 | 0 | 0 |
| 1 | 6 | DRV_UCLK | −1 | −1 | 1 | 16 | 10 | D | DQ1 | B_1 | 0 | 0 |
| 2 | 22 | DRV_CS | −1 | −1 | 1 | 2 | 21 | D | OE | CS_1 | 0 | 0 |
| 2 | 22 | DRV_UCLK | −1 | −1 | 1 | 23 | 17 | D | DQ1 | B_1 | 0 | 0 |
| 2 | 22 | DRV_CS | −1 | −1 | 1 | 1 | 21 | D | OE | CS_1 | 0 | 0 |
| 2 | 22 | DRV_CS | −1 | −1 | 1 | 9 | 17 | D | OE | CS_1 | 0 | 0 |
| 1 | 6 | DRV_UCLK | −1 | −1 | 1 | 16 | 2 | D | DQ1 | B_1 | 0 | 0 |
| 1 | 6 | DRV_CS | −1 | −1 | 1 | 27 | 3 | D | OE | CS_1 | 0 | 0 |
| 1 | 6 | DRV_UCLK | −1 | −1 | 1 | 36 | 14 | D | DQ1 | A_1 | 0 | 0 |
| 2 | 22 | DRV_CS | −1 | −1 | 1 | 16 | 32 | D | OE | CS_1 | 0 | 0 |
| 1 | 6 | DRV_UCLK | −1 | −1 | 1 | 18 | 6 | D | DQ1 | B_1 | 0 | 0 |
| 1 | 6 | DRV_CS | −1 | −1 | 1 | 34 | 10 | D | OE | CS_1 | 0 | 0 |
| 2 | 22 | DRV_UCLK | −1 | −1 | 1 | 6 | 21 | D | DQ1 | A_1 | 0 | 0 |
| 1 | 6 | DRV_CS | −1 | −1 | 1 | 31 | 14 | D | OE | CS_1 | 0 | 0 |
| 1 | 6 | DRV_UCLK | −1 | −1 | 1 | 32 | 6 | D | DQ1 | A_1 | 0 | 0 |
| 2 | 22 | DRV_UCLK | −1 | −1 | 1 | 8 | 25 | D | DQ1 | A_1 | 0 | 0 |

The fields at the top of the columns of the table above stand for the following:

ZONE NUMBER: index to indicate membership to a pattern zone, determined by pattern generator board 260.

SLOT NUMBER: location of a driver or power board 262 or 264.

CHANNEL TYPE: type of hardware resource to be used.

RAB NUMBER: index of reference and acquisition module on the power board 264, or −1 if not applicable.

PWR MODULE NUMBER: power module on power board 264.

CHANNEL NUMBER: resource index of given board 262 or 264.

COLUMN, ROW: position of the device 266 on the wafer (or testboard).

CONN TYPE: connection type; D for device, or T for termination; whether a resource influences a device directly, or provides auxiliary electrical characteristics to the test assembly.

PAD LABEL: designator for the terminal 72 or pin 68 that the resource is connected to; this label is then used for programming purposes.

TERM LABEL: option label for a termination pin.

COMMON KEY: option sort key.

MASK: field to determine whether a device should be tested or not.

Some resources are provided separately to each of the devices 300. For example, there may be a total of 600 of the devices 300, and each device may require a separate input/output line connected through the interconnection scheme 302. Other resources may be shared in order to reduce the number of electrical paths that are provided through the interconnection scheme 302. For example, a single input/output line 320 can be provided through the interconnection scheme 302, and at the last level within the interconnection scheme 302 be fanned to a set (or all) of the devices 300. An input/output signal is thus provided to all the devices 300 of the set. A chip select line 322 can be accessed to select a subset of the devices of the set to which the input/output line 320 is connected. Unique chip select line combinations are then grouped into chip select states.

Figure 24A:
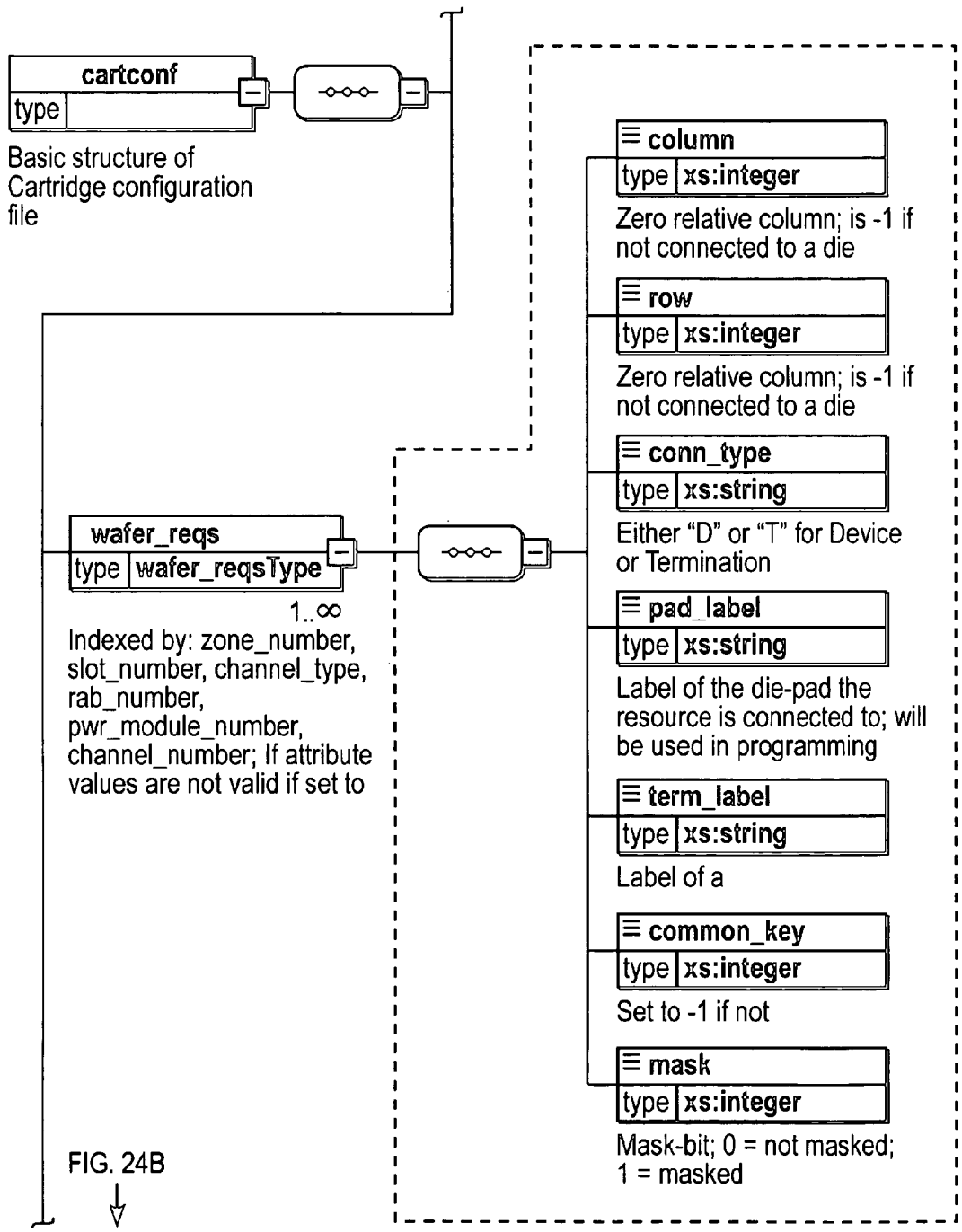
FIGS. 24A and 24B show a block diagram illustrating a database structure of the configuration file.
Figure 24B:
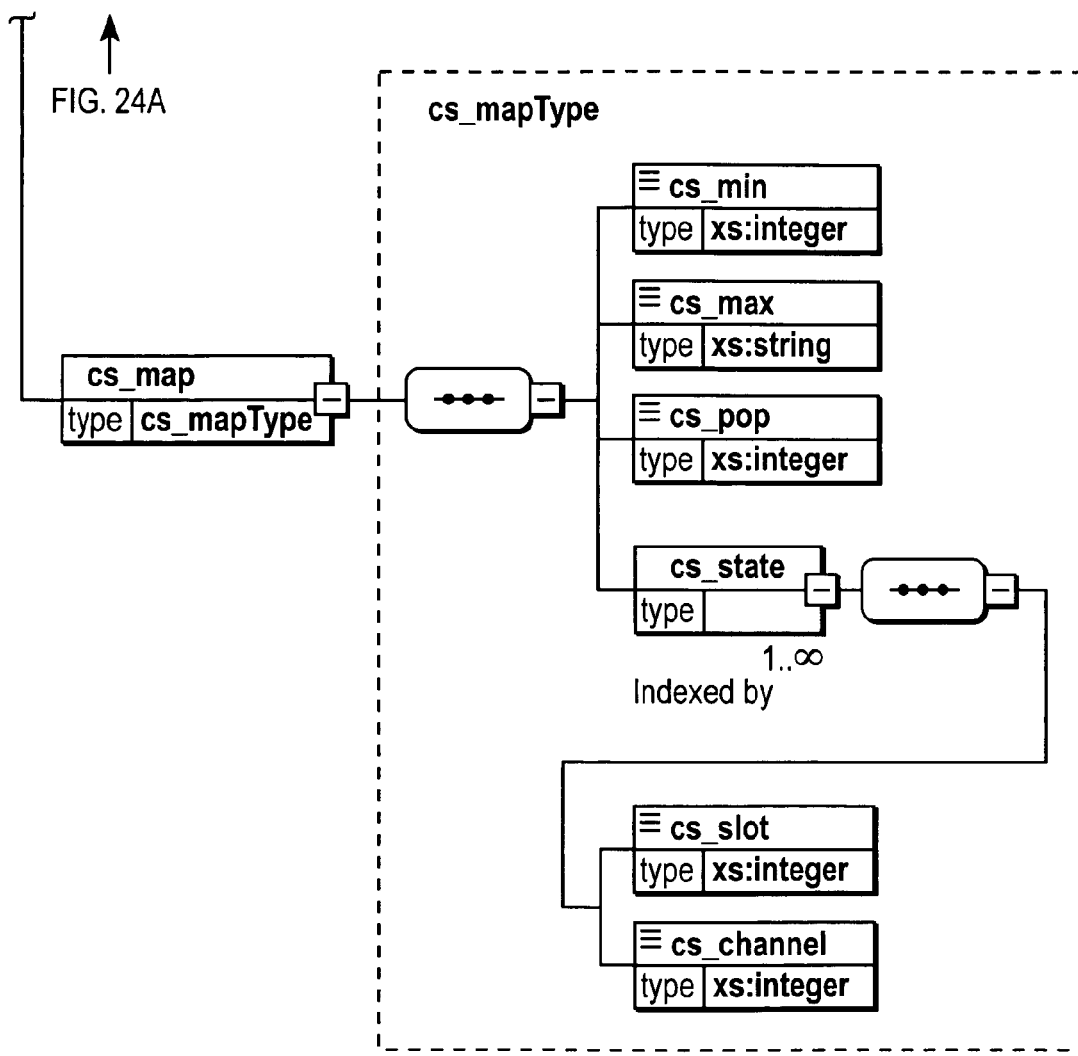

FIGS. 24A and 24B illustrate the data structure of the configuration file 310 ("cartconf"). The configuration file 310 includes both a wafer requirement data structure (wafer_reqs) and a shared resources map (cs_map) representing the chip select states. Descriptions of the respective fields and what the fields represent are described in FIGS. 24A and 24B.

Again referring to FIGS. 22 and 23, a response from each one of the devices 300 is provided through the interconnection scheme 302 and stored in memory of the driver and power boards 262 and 264 (step 408). The system software uploads the responses from the driver and power boards 262 and 264 into the test results file 314 (step 410). The test results file 314 has raw data wherein the test results of all the devices 300 are collated. The test results file 314 is provided to a processing application 316. The processing application 316 utilizes the configuration file 310 to interpret the test results file 314 in such a manner that the test results of individual ones of the devices 300 are extracted from the test results file 314 (step 412). The processing application 316 then publishes the test report 318 (step 414). The test report 318 is typically a two-dimensional map on a computer screen with cells representing the devices 300, wherein functioning and defective devices are shown in different colors. The test results file 314 is also to be used by the test application 312 to modify the instructions provided to boards 260, 262 and 264.

Figure 25:
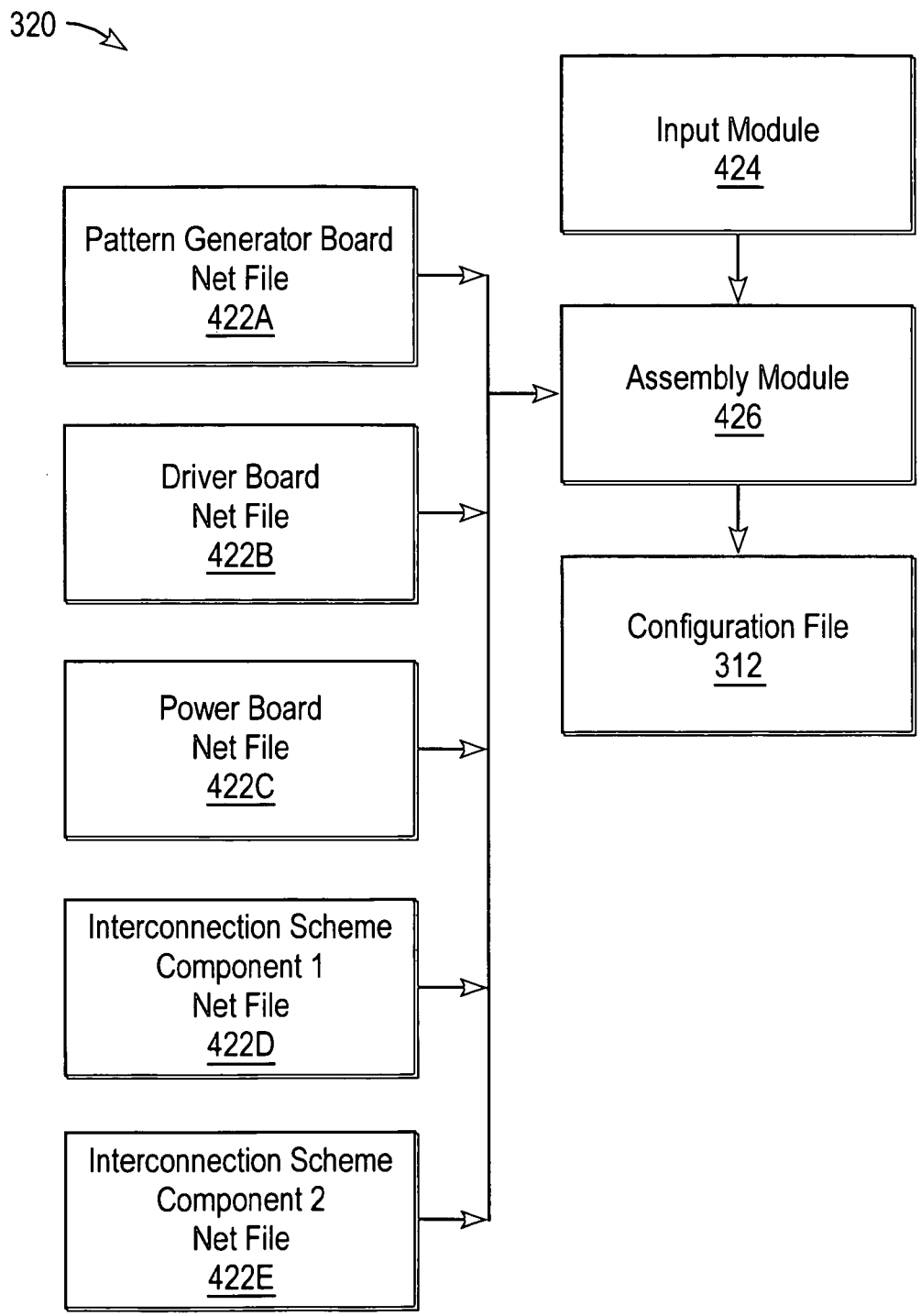
FIG. 25 is a block diagram of a software assembler application that is used to construct the configuration file from a plurality of net files.

FIG. 25 illustrates a software assembly application 420 that is used for constructing the configuration file 312 of FIG. 19. The application 420 includes a plurality of net files 422, an input module 424, and an assembly module 426. The net files 422 each represent a scheme of current passing through conductors of a respective electrical subassembly. For example, the net file 422A is a pattern generator board net file representing the flow of current through one of the pattern generator boards 260 of FIG. 19. Similarly, the driver board net file 422B and power board net file 422C respectively represent flow of current through conductors through one of the driver boards 262 and one of the power boards 264. The interconnection scheme 302 also has multiple components, and a respective net file 422D or 422E represents flow of current through a respective component of the interconnection scheme 302.

Figure 26:
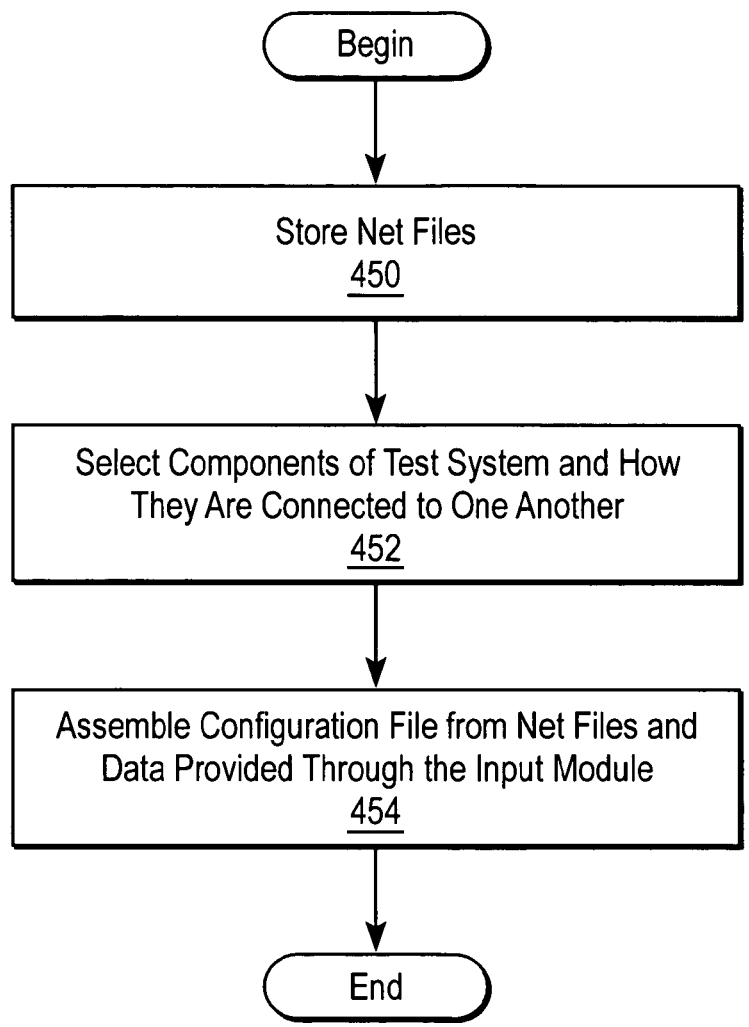
FIG. 26 is a flowchart of how the software assembler application of FIG. 22 assembles the configuration file.

Referring now to FIGS. 25 and 26 in combination, the net files 422 are first stored in memory of a computer system on which the software assembly application 418 resides (step 450). The input module has an interface with a list of the components that can make up the tester system 304. The list includes one pattern generator board, one driver board, one power board, and one type of each component that can make up the interconnection scheme 302. The input module 424 also allows an operator to select how many of the components on the list are used to assemble the tester system 304, and how the components are connected to one another. For example, the operator can select two pattern generator boards and three driver boards, one of the driver boards being connected to one of the pattern generator boards and the other two driver boards being connected to the other pattern generator board (step 452).

The assembly module 426 then uses the input provided by the operator via the input module 424 and the net files 422 to assemble the configuration file 310. In the given example, the assembly module 426 will construct the configuration file 310 so that it has data representing two pattern generator net files 422A and three driver board net files 422B, with one driver board net file 422B being associated with one pattern generator board net file 422A and the other two pattern generator net files 422B being associated with the other pattern generator board net file 422A (step 454). The configuration file 310 can then be transferred from the computer system on which the software assembler application 420 resides to the local controller 306 of FIG. 22.

Figure 27:
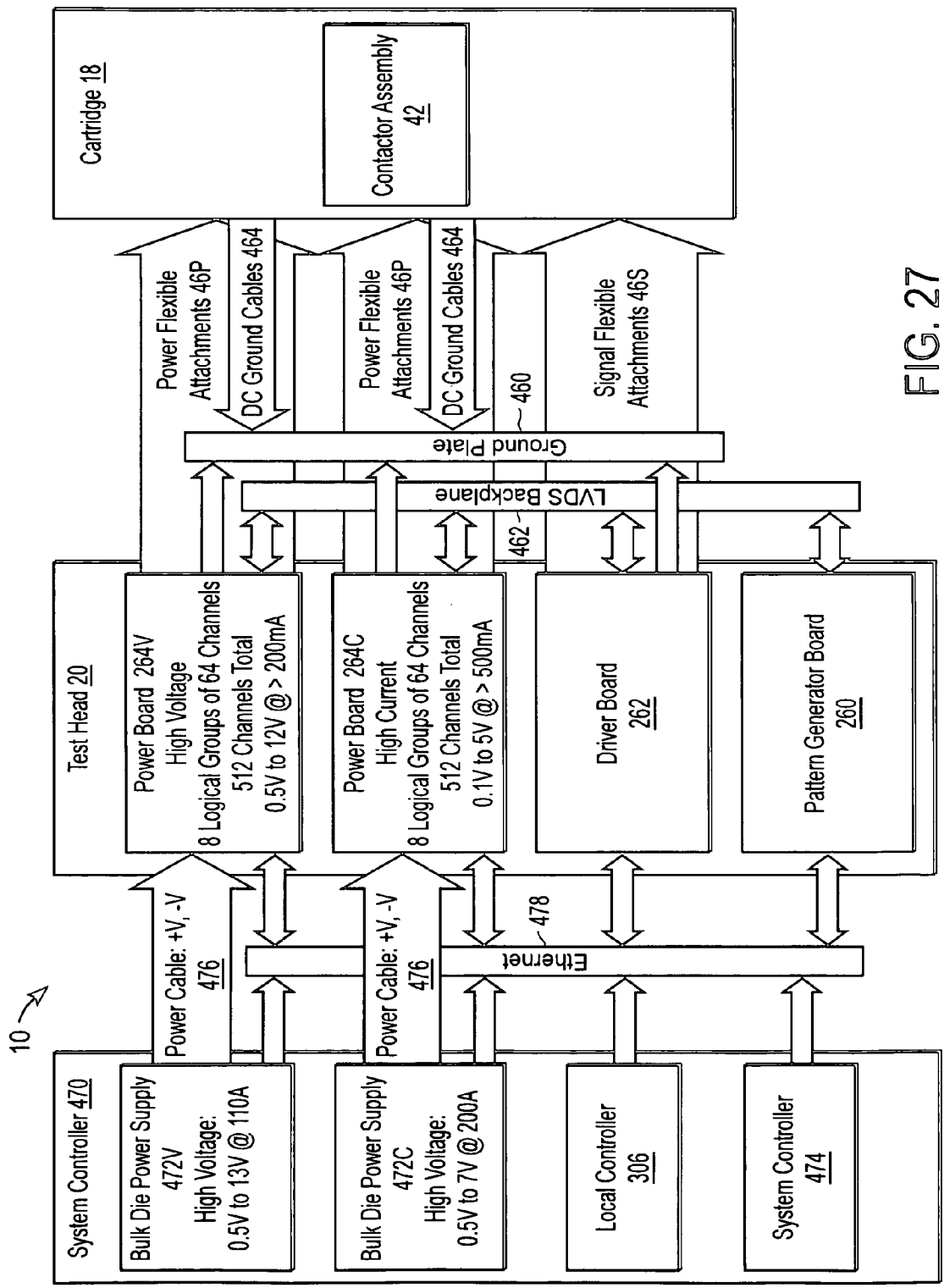
FIG. 27 is a block diagram of electrical components of the apparatus of FIG. 1.

FIG. 27 illustrates some of the components hereinbefore described and some additional components of the apparatus 10. The components hereinbefore described include the cartridge 18 that has the contactor assembly 42, the flexible attachments 46, two of the power boards 264, one of the driver boards 262, one of the pattern generator boards 260, and the local controller 306. Two types of power boards 264V and 264C are used, for high voltage and high current respectively. Each power board 264V or 264C has eight logical groups of 64 channels, and therefore 512 channels in total. The high-voltage power board 264V can provide a voltage output of 0.5 V to 12 V at a current of at least 200 mA for each channel. The high-current power board 264C can provide an output of 0.1 V to 5 V at a current of at least 500 mA. The locations of the boards 260, 262, and 264 have been described with reference to FIG. 20.

Each one of the power boards 264V or 264C is connected to the contactor assembly 42 through four dedicated power flexible attachments 46P. The driver board 262 is connected to the contactor assembly 42 through dedicated signal flexible attachments 46S. The flexible attachments 46 have been described with reference to FIG. 3. The flexible attachments 46 connecting at site 92 at the distribution board 48 also provide alternating current (AC) ground from the contactor assembly 42 to the boards 262 and 264.

The apparatus 10 further includes a ground plate 460 and a Bussed low-voltage differential signaling (LVDS) backplane 462 mounted within the test head 20. The power boards 264V and 264C and the driver board 262 each have two direct current (DC) connection pins 508, as illustrated in FIG. 18, that connect to the ground plate 460. The DC pins 508 also pass through the ground plate 460 and connect to the block support piece 184, shown in FIG. 17. DC ground cables 464 connect the block support piece 184 to the signal distributor board 48, shown in FIG. 4, at the DC connection site 461, illustrated in FIG. 6, and thereby provide a DC ground path from the boards 262 and 264, the contactor assembly 42, and the wafer 76. FIG. 3 illustrates connectors 466 to which the DC ground cables 464 are attached at the block support piece 184 of the cartridge 18.

The boards 260, 262, 264C, and 264V each have a connection that connects respective board to the Bussed LVDS backplane 462. A logical link is thereby provided between the boards 260, 262, 264C, and 264V, allowing the boards to communicate with one another. It is also the Bussed LVDS backplane 462 that provides the logical link between the boards 260, 262, and 264 illustrated in FIG. 22.

The apparatus 10 further has a system control bay 470 that includes a bulk die power supply 472V for high voltage, a bulk die power supply 472C for high current, the local controller 306 described with reference to FIG. 22, and a system controller 474. The bulk die power supply 472V can provide a voltage of 0.5 V to 13 V at 110 A, and the bulk die power supply 472C can provide a voltage of 0.5 V to 7 V at 200 A. The bulk die power supply 472V is connected through respective power cables 476 to power board(s) 264V. Similarly, the bulk die power supply 472C is connected through respective power cables 476 to power board(s) 264C.

An Ethernet link 478 connects and networks the bulk die power supplies 472V and 472C, the local controller 306, the system controller 474, and the boards 260, 262, 264C, and 264V with one another. The local controller 306 controls the boards 260, 262, 264C, 264V, and 474 through the Ethernet link 478 and peripheral components of the apparatus 10.

Figure 28:
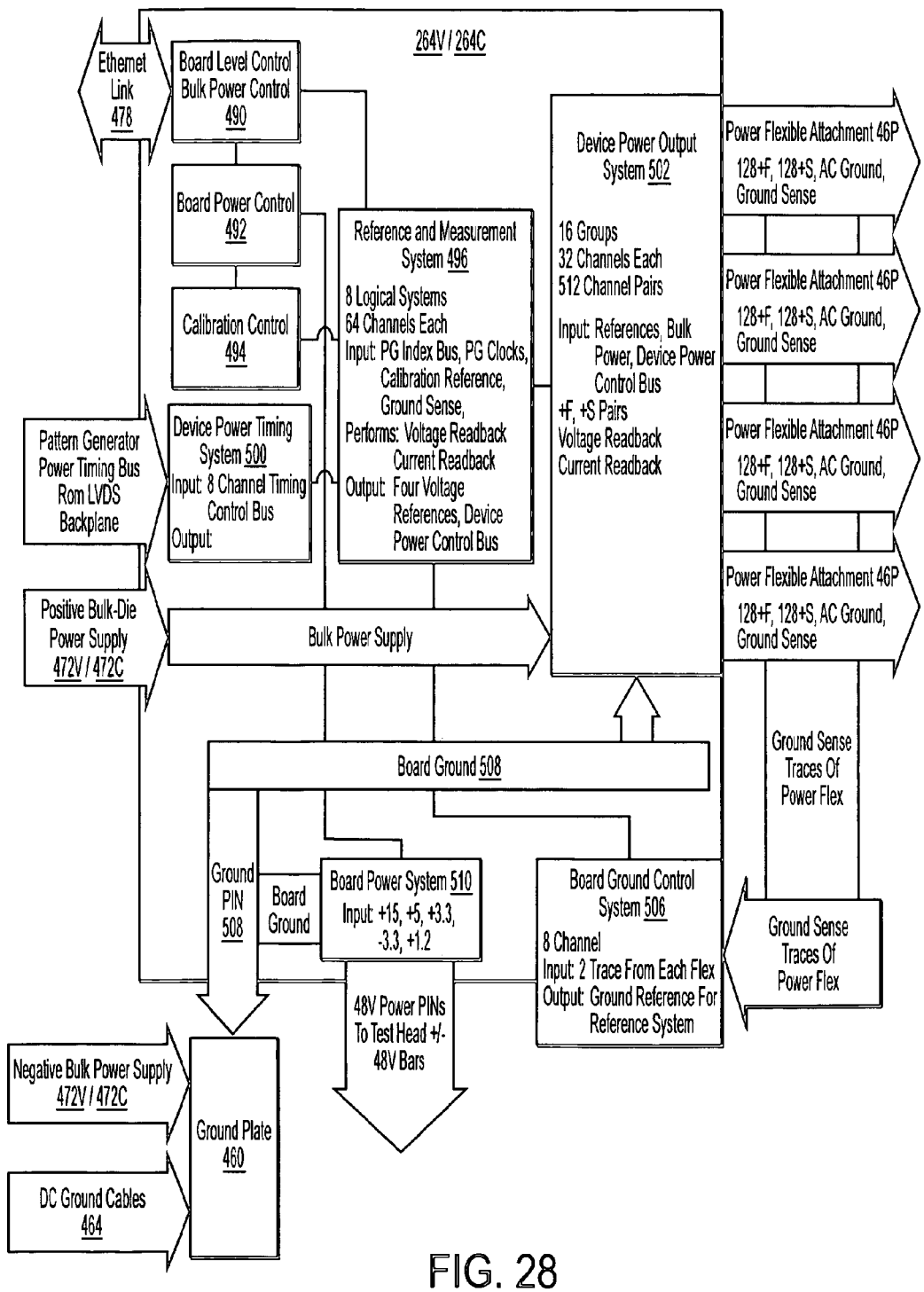
FIG. 28 is a block diagram of components of a power board illustrated in FIGS. 22 and 27, and connections made to the power board.

FIG. 28 illustrates one of the power boards 264V or 264C and its connections to the ground plate 460, and power flexible attachments 46P. A board-level control and bulk power control 490 is connected to the Ethernet link 478. A board power control 492 and calibration control 494 are connected to the board-level control and bulk power control 490. The board-level control and bulk power control 490, device power timing system 500, and the calibration control 494 are connected to a reference and measurement system 496 and provide a series of instructions to the reference and measurement system 496. The instructions have been described with reference to FIG. 22 (the instructions that are provided by the board-level control and bulk power control 490, the device power timing system 500, and calibration control 494 to the reference and measurement system 496 have, for purposes of explanation, been equated to chords in a music score).

The pattern generator board 260 has a pattern generator power timing bus that is connected through the Bussed LVDS backplane to a device power timing system 500. The device power timing system 500 is connected to the reference and measurement system 496. The device power timing system 500 provides both timing and instructions to the reference and measurement system 496 for purposes of carrying out the instructions that are provided from the board-level control and bulk power control 490 and calibration control 494 (the functioning of the device power timing system 500 has, for purposes of explanation, been equated to an orchestra conductor that provides both timing and instructions of which chords are to be played). The reference and measurement system 496 includes eight logical systems of 64 channels each, thus totaling 512 channels. Inputs into the reference and measurement system include signals from the pattern generator index bus, pattern generator clocks, calibration reference, and ground sense. The reference and measurement system 496 performs voltage readback and current readback. Output from the reference and measurement system 496 includes four voltage references and device power control through a device power control bus. Output from the reference and measurement system 496 thus includes logic for purposes of controlling power.

The reference and measurement system 496 and board-level control and bulk power control 490 are connected to a device power output system 502. A positive side of the bulk die power supply 472V or 472C is also connected to the device power output system 502 through cable 476. The device power output system 502 regulates the power from the bulk die power supply 472V or 472C, utilizing the signal from the reference and measurement system 496 (the power provided by the bulk die power supply 472V or 472C has, for purposes of explanation, been equated to power or air that is provided simultaneously to a number of music instruments in an orchestra). The device power output system 502 includes 16 sections of 32 channels, grouped into 8 logical groups, thus totaling 512 channels. Each channel includes a Kelvin sense system, each system including one force (+F) and one sense (+S) line, so that there are a total of 1,024 pins and circuits. Input into the device power output system 502 includes references, bulk power, control parameters from board-level control and bulk power control 490, and device power control through the device power control bus. The device power output system 502 also provides voltage and current readback to the reference and measurement system 496 and channel status information to the board-level control and bulk power control 490.

Four of the power flexible attachments 46P are connected to the device power output system 502. Each power flexible attachment 46P includes 128 +F lines, 128 +S lines, AC ground, and ground sense.

Two ground sense traces from each power flexible attachment 46P, thus totaling eight traces, are connected to a board ground control system 506. The board ground control system 506 averages eight measurements from the ground sense traces, and provides the averaged result as an output to the reference and measurement system 496.

A ground pin 508 is connected to the ground plate 460 and the first connector sets 44. The ground pin 508 is connected to both the device power output system 502 and to a board power system 510. The board power system 510 has a separate 48 V input, and can provide, for example, outputs of 15 V, 5 V, 3.3 V, −3.3 V, and 1.2 V. The DC ground cables 464 are connected to the block support piece 184. The negative side of the bulk die power supply 472V or 472C is also connected through the power cable 476 to the ground plate 460.

What should be noted is that separate paths are provided for AC ground and for DC ground. AC ground is provided through the flexible attachments 46P that also deliver the power. The physical space between F+ power provision, the S+ line, and AC power ground in a power flexible attachment 46P is extremely small, typically on the order of between 0.002 and 0.010 inches. Such a small space allows for a substantial reduction in noise and an increase in speed, which is particularly important for accurate measurement through the 512 sense lines and clean power delivery through the F+ lines. DC ground is provided through the DC ground cables 464. The AC and DC grounds have, for example, respective resistances of between 0.5 and 1.5 ohms and 0.003 and 0.015 ohms.

Figure 29:
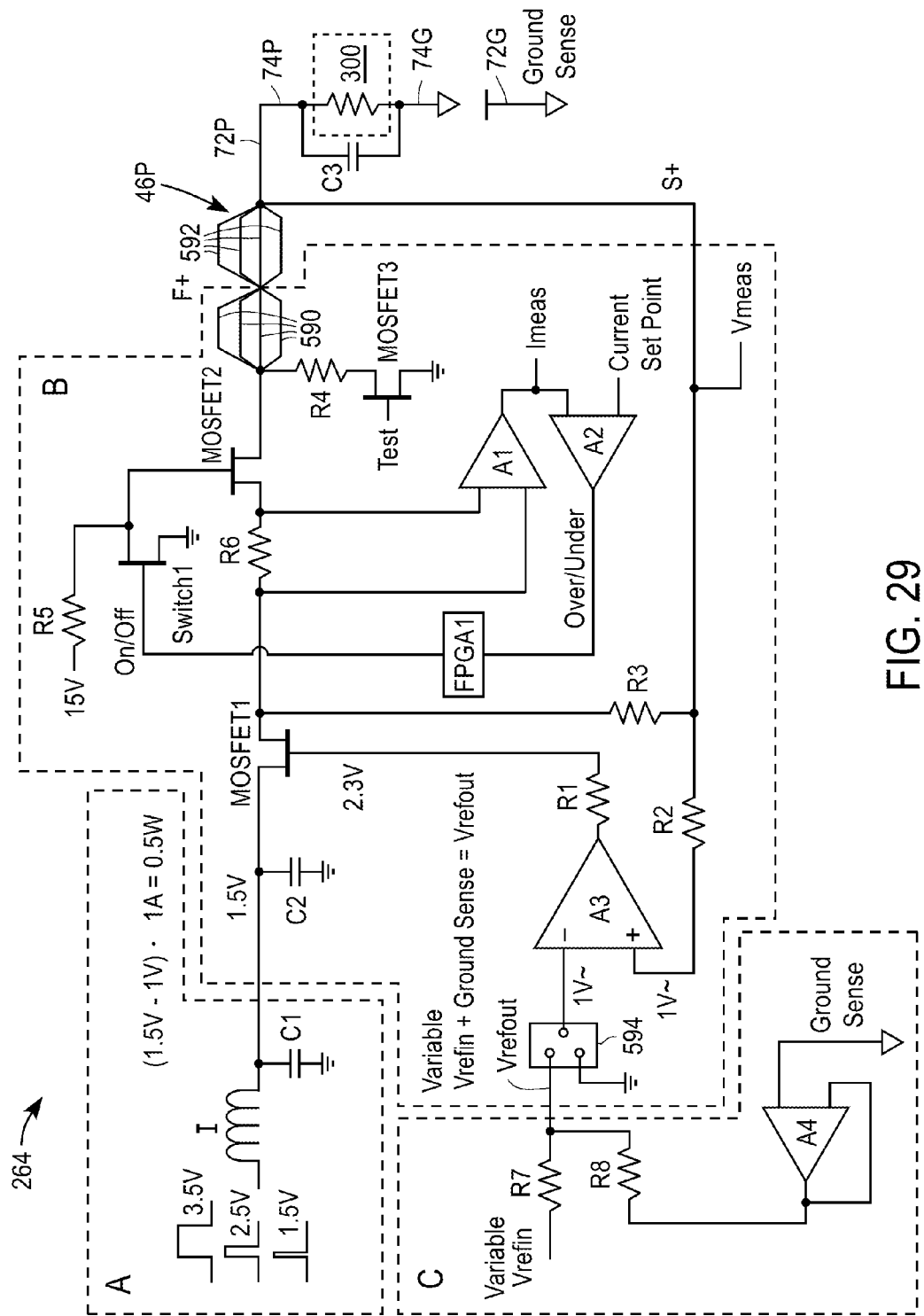
FIG. 29 is a circuit diagram illustrating components that are replicated on the power board of FIG. 28.

FIG. 29 illustrates components of the device power output system 502 in more detail. The device power output system 502 includes only a single one of subsystem A. The subsystem B is replicated 512 times and is in eight groups of 64, and the 512 subsystems B are connected in parallel to the subsystem A. The subsystem C is replicated eight times, and the eight subsystems C are connected in parallel to the subsystem B.

Subsystem A includes die bulk power supply 472 and power cables 476 which include an AC-to-DC conversion circuit comprising an inductor I and a capacitor C1 connecting an output terminal of the inductor I to ground and is controlled by board-level control and bulk power control 490 and local controller 306 through 478. An input terminal of the inductor I is connected to the die bulk power supply 472V or 472C in FIG. 27. A stepped voltage cycle is provided to an input terminal of the inductor I. An amplitude and a period of the stepped voltage cycle always remain constant, but an amount of time that the voltage is high during a particular period can be modulated. The total amount of time that the voltage is high can thus be modulated from a small percentage of the total time to a large percentage of the total time. The inductor I and capacitor C1 convert the voltage step to a DC voltage. The DC voltage can thus also be modulated, depending on the percentage of time that the voltage provided to the input terminal of the inductor I is high. The die bulk power supply 472V or 472C allows for a variable voltage to be created per power board 264. The DC voltage can thus be modulated, depending on the need to control power dissipation in the device power output system 502. The reference and measurement system 496 allows for 16 different voltages to be created per group of 64 channels. Different voltages can be provided to different groups of 64 channels at a particular moment in time.

The DC voltage created by the subsystem B is provided through a force F+ line through a power terminal 72P to a power contact 74P of a respective device 300 (see also reference numerals 72 and 74 in FIG. 4). A sense line S+ is connected to the power terminal 72 or 56 and detects a voltage at the power terminal 72. The voltage detected by the sense line S+ is provided through a resistor R2, an amplifier A3, and a resistor R1 to control a MOSFET 1 located in the force line F+. The amplifier A3 also receives at its positive terminal an input (Vref) through a switch 594. The amplifier A3 is set so that the voltages provided at its positive and negative terminals are combined to provide an output voltage to the MOSFET 1. The voltage Vrefout provides an input voltage, which is the desired voltage provided to the power terminal 72P, and the sense line S+ provides a feedback through the amplifier A3 to keep the voltage provided to the MOSFET 1, and therefore the power terminal 72P, at a steady state. The amplifier A3 provides a voltage (Vrefout+$V_{GS}$), in this case 2.3 V, to the MOSFET 1 if the voltage provided by the subsystem A is 1.5 V and the power terminal 72P requires a voltage of 1 V. The MOSFET 1 dissipates heat equivalent to a difference between the voltage provided by the subsystem A and the voltage on the force line F+, multiplied by the current. For example, the voltage provided by the subsystem A can be 1.5

V, and the force line F+ can provide a voltage of 1 V. If the current is 1 A, the power dissipated by the MOSFET 1 is 0.5 W. Should the voltage provided by the subsystem A always be a maximum of, for example, 12 V, the MOSFET 1 would have to dissipate 11 W. The variable power provided by the bulk die power supplies 472V and 472C in FIG. 27 thus substantially assist in reducing the amount of energy, and therefore heat, dissipated by the MOSFET 1.

A resistor R3 is connected between the force and sense lines F+ and S+ and resistively connects the F+ to the S+ of the amplifier A3. The resistor R3 serves to control the amplifier A3 in case of a failure by holding the force and sense lines F+ and S+ to similar voltages. The resistor R3 is thus just a safety device in case of contact failure.

The subsystem B also includes a circuit that automatically switches power to the device 300 off upon the detection of an overcurrent, among other things. The overcurrent detection and switching circuit includes a resistor R6 located after the MOSFET 1 in the force line F+. A voltage over the resistor R6 is linearly related to a current through the force line F+. An amplifier A1 amplifies the voltage detected over the resistor R6. A comparator A2 compares an output from the amplifier A1 to a current set point supplied by reference and measurement system 496. An output from the comparitor A2 would be zero if the output from the amplifier A1 is the same as, or greater than, the current set point.

The output from the comparitor A2 provides an indication of an overcurrent or undercurrent through the resistor R6. The output from the comparitor A2 is provided to a field programmable gate array (FPGA) 1. The FPGA 1 has logic that determines whether the over- or undercurrent is sufficient to switch subsystem B off. The FPGA 1 also provides for a timing delay before switching the current off, to allow for brief surges in current without switching the current off. An output of the FPGA 1 is provided to a switch 1 and a switch 2 594.

During normal operating conditions, i.e., when the current should continue to flow, the switch 1 is switched into its "off" position and the switch 2 in its "A" position. A voltage of 15 V is provided through a resistor R5 to one terminal of the switch and to a MOSFET 2 located after the resistor R6 in the force F+ line. During normal operating conditions, the voltage provided through the resistor R5 maintains the MOSFET 2 in an "on" position, thereby allowing current to flow through the force line F+. Should an overcurrent be detected, the FPGA 1 switches the switch 1 to its "on" position, thereby grounding the voltage provided through the resistor R5, the MOSFET 2 will switch into its "off" position and disconnect the current, and switch 2 is set to the "B" position, shutting down the amplifier A3.

What should be noted is that each one of the 512 subsystems B has its own overcurrent detection and switching circuit. The 512 overcurrent and switching circuits allow for currents to one or more of 512 individual devices to be switched off, while current to the other devices continues to flow. Current measurement and voltage measurement can also be done on a per-device level, because each one of the subsystems B has a respective current measurement line (Imeas), and a respective voltage measurement line (Vmeas). The current measurement line Imeas is connected to an output of the amplifier A1, and the voltage measurement line Vmeas is connected to the sense line S+. The current and voltage measurement lines Imeas and Vmeas allow for real-time measurement of current and voltage provided to the power terminal 72P. The subsystem B also includes a switching circuit having a resistor R4 and a MOSFET 3. The resistor R4 is connected to the force line F+ after the MOSFET 2, and the MOSFET 3 is connected in series after the resistor R4. A test signal (Test) can be provided to the MOSFET 3, thereby drawing current through the force line F+ for self-testing.

A high-frequency response is required for the circuit that includes the resistors R1, R2, and the amplifier A3. For this purpose, a capacitor C3 is provided in parallel with the integrated circuit of the device 300. The capacitor C3 is built into the support structure 80 shown in FIG. 4. The force line F+ should have a relatively low inductance to allow for proper functioning of the capacitor C3 and high-frequency response of the circuit, including the resistors R1 and R2 and the amplifier A3. For this purpose, the force line F+ includes two sets of parallel power conductors 590 and 592, respectively. The subsystems A and B are connected to a single substrate with the conductors 590 of the first set are traces that are formed on the substrate. The conductors 590 all have first ends that are connected to one another and second ends that are connected to one another, so that middle sections of the conductors 590 conduct current in parallel. The second ends of the conductors 590 are connected to a common pin. The conductors 592 are in the form of individual electric lines in a respective power flexible connection 46P. First ends of the conductors 592 are connected to one another and second ends of the conductors 592 are connected to one another, so that middle sections of the conductors 592 conduct the current received from the conductors 590, in parallel. The second ends of the conductors 592 are all connected to one power terminal 72P.

The distribution board 48 has two ground sense contacts at each interface 92. Ground sense terminals at each interface 92 connect to the ground sense contacts 74G. Eight ground sense lines are provided to a grounding modulation circuit, including an amplifier A4 and a filter 201. The voltage detected at the ground sense contact 74G is added by the ground modulation circuit to a variable input voltage (Vrefin). Ideally, the voltage detected at the ground sense contact 74G is 0 V, in which case the voltage variable Vrefin would be equal to the voltage Vrefout. If the voltage detected at the ground sense contact 74G is not zero, for example, it is 0.1 V, then Vrefout would be driven to 1.1 V (Vrefin+0.1 V). The voltage provided to the negative terminal of the amplifier A3 would then also be 1.1 V, and the voltage provided to the power terminal 74P would be 1.1 V.

FIG. 30 illustrates one channel of the driver board 262 shown in FIGS. 22 and 27. The same signal illustrated in FIG. 30 is replicated for each of multiple channels of the driver board 262.

Also illustrated in FIG. 30 are multiple ones of the devices 300 and their respective ground sense contacts 72G. Voltages detected by respective ground sense terminals on the ground sense contacts 74G (or 72G) are averaged and provided to a filter 700. Under normal operating conditions, the voltage provided to the filter 700 would be 0 V. There may sometimes be a small deviation from 0 V, for example, 0.1 V. The 0.1 V is provided by the filter 700 to a positive terminal of an amplifier A4. A negative terminal of the amplifier A4 is then also driven to 0.1 V. One resistor R9 is connected between the negative terminal and an output of the amplifier A4. A resistor R10, having the same resistance as the resistor R9, is also connected to the negative terminal of the amplifier A4. A 10 V voltage source 702 is connected over the resistors R9 and R10. Two terminals of the voltage source 702 are then 5 V above and 5 V below the voltage at the negative terminal of the amplifier A4, and thus at −4.9 V and 5.1 V, respectively.

The terminals of the 10 V voltage source 702 are connected to respective terminals R+ and R− of a digital-to-analog converter (DAC) 704. The DAC 704 also has output terminals, and has the ability to switch each output terminal to a voltage between −4.9 V and 5.1 V.

A microprocessor bus 705 is connected to the DAC 704. Information representing desired high and low voltages can be loaded from the microprocessor bus 705 into the DAC 704. The DAC 704 can, for example, be programmed with a high voltage of 3 V and a low voltage of 2 V. Because the voltage provided to the positive terminal of the amplifier A4 is at 0.1 V, the output terminals of the DAC are, in this example, held at 3.1 V and 2.1 V, respectively.

The output terminals of the DAC are connected to high-voltage and low-voltage (VH and VL) terminals of a voltage switch 706. The pattern generator board 260 illustrated in FIGS. 22 and 27 provides a signal source 708 to a signal terminal of the voltage switch 706. The voltage switch is a bus switch in the present example, having a 5 V power supply voltage. The signal source 708 switches between alternating true and false states. In a true state, a first terminal of the switch 706 connected to the high-voltage VH is connected to an output of the switch 706, and in a false state, the terminal connected to the low-voltage VL is connected to the output of the switch 706. The output of the switch 706 thus switches between 3.1 V and 2.1 V in response to the signal source 708.

A damping circuit, including a resistor R11 and a capacitor C4, has an input connected to the output of the switch 706. The resistor R11 has one terminal connected to the switch 706, and an opposing terminal of the resistor R11 is connected through the capacitor C4 to ground. An effect of the damping circuit represented by the resistor R11 and capacitor C4 is that a slew rate of a signal provided on the output of the switch 706 is reduced. The switch 706 provides a square wave at its output, and the damping circuit has an output that responds to the square wave in a non-square fashion. Specifically, the voltage on the output of the damping circuit increases more slowly than the voltage provided to the input of the damping circuit.

The response voltage of the damping circuit is provided to an amplifier A5 with a gain of two, and then through a switch 708 to respective signal contacts 74S (see also reference numeral 74 in FIG. 4) of the devices 300. Because the signal provided to the devices 300 is dampened, ringing can be reduced or be eliminated.

FIG. 31 illustrates a prior art solution, wherein a termination damping circuit is provided at a termination of one device. The termination damping circuit provides a dampening effect at the device that is being tested. However, the functioning of the termination depends to a large extent on the length of a line connected to the device that is being tested. As illustrated in FIG. 30, the signal contacts 74S can be at different distances from the damping circuit, as measured along a length that current flows in the circuit, and can be used without a termination damping circuit. Furthermore, the signal contacts 74S can be spaced differently from one application to another, for example, by 10 inches in one application and 18 inches in another application, and the same damping circuit will reduce ringing in each application.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An apparatus for testing an integrated circuit of a device, comprising:
    an apparatus frame;
    a holder, having a surface against which the device is placed, mounted to the apparatus frame;
    a cartridge frame mounted to the apparatus frame;
    a contactor support structure;
    a contactor interface on the contactor support structure;
    a plurality of terminals held by the contactor support structure;
    a plurality of conductors, held by the contactor support structure, connecting the interface to the terminals; and
    an actuator connected between the cartridge frame and the contactor support structure, having first and second portions that are movable relative to one another to move the contactor support structure relative to the cartridge frame and toward the surface of the holder so that the terminals are urged against contacts of the device.

2. The apparatus of claim 1, wherein the first and second portions of the actuator are a cylinder and a piston, respectively, the piston being located in the cylinder so that the cylinder and the piston jointly define a volume, further comprising a fluid line connected to the volume to modify a pressure of the volume and move the piston relative to the cylinder.

3. The apparatus of claim 1, further comprising a travel sensor for measuring the movement of the contactor support structure relative to the cartridge frame.

4. The apparatus of claim 2, wherein the cartridge frame includes a lower backing plate and a support structure, and wherein the travel sensor includes an outer portion attached to the support structure and an inner portion attached to the backing plate, and wherein actuation of the actuator causes the relative movement between the outer portion and the inner portion.

5. The apparatus of claim 3, wherein the travel sensor measures the change of inductance or capacitance between the outer portion and the inner portion.

6. An apparatus for testing an integrated circuit of a device, comprising:
    an apparatus frame;
    a holder, having a surface against which the device is placed, mounted to the apparatus frame;
    a cartridge frame mounted to the apparatus frame;
    a contactor support structure;
    a contactor interface on the contactor support structure;
    a plurality of terminals held by the contactor support structure;
    a plurality of conductors, held by the contactor support structure, connecting the interface to the terminals;
    a variable-force actuator connected between the cartridge frame and the contactor support structure, having first and second portions that are movable relative to one another to move the contactor support structure relative to the cartridge frame and toward the surface of the holder so that the terminals are urged against contacts of the device; and
    a travel sensor connected to the cartridge frame for measuring the movement of the cartridge frame relative to the apparatus frame.

7. The apparatus of claim 6, wherein the cartridge frame includes a lower backing plate and a support structure, and wherein the travel sensor includes an outer portion attached to the support structure and an inner portion attached to the backing plate, and wherein actuation of the actuator causes the relative movement between the outer portion and the inner portion.

8. The apparatus of claim 6, wherein the device with the holder is moveable relative to the frame in a direction toward the contactor support structure.

9. The apparatus of claim 6, wherein the variable-force actuator comprises a piston.

10. The apparatus of claim 9, wherein the pressure of the piston is set so that the piston is in the middle of its stroke when the terminals are urged against the contacts of the device.

\* \* \* \* \*